(12) United States Patent
Venkataramani et al.

(10) Patent No.: US 8,352,505 B1
(45) Date of Patent: Jan. 8, 2013

(54) IDENTIFICATION OF RESOURCE SHARING PATTERNS THROUGH ISOMORPHIC SUBTREE ENUMERATION

(75) Inventors: Girish Venkataramani, Boston, MA (US); Partha Biswas, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 381 days.

(21) Appl. No.: 12/425,207

(22) Filed: Apr. 16, 2009

Related U.S. Application Data

(60) Provisional application No. 61/045,488, filed on Apr. 16, 2008.

(51) Int. Cl.
*G06F 7/00* (2006.01)
*G06F 17/30* (2006.01)
(52) U.S. Cl. .......................... 707/802; 707/756; 707/769
(58) Field of Classification Search .................. None
See application file for complete search history.

(56) References Cited

U.S. PATENT DOCUMENTS 7,502,803 B2 * 3/2009 Culter et al. ........................ 1/1
7,685,095 B2 * 3/2010 Ghosh et al. ............ 707/999.002

OTHER PUBLICATIONS

Jason Cong et al., "Pattern-Based Behavior Synthesis for FPGA Resource Reduction", Computer Science Department, University of California, Feb. 24-26, 2008, 10 pages.*
Pekka Kilpelainen et al., "Ordered and Unordered Tree Inclusion", Society for Industrial and A~oplied Mathematics, 1995, pp. 340-356.*
Partha Biswas et al., "Comprehensive Isomorphic Subtree Enumeration", Oct. 19-24, 2008, 9 pages.
Taewhan Kim et al., "A Scheduling Algorithm for Conditional Resource Sharing", Department of Computer Science, University of Illinois at Urbana-Champaign, IEEE, 1991, pp. 84-87.
Samuel R. Buss, "Alogtime Algorithms for Tree Isomorphism, Comparison, and Canonization", Departments of Mathematics & Computer Science, University of California, San Diego, 1997, pp. 1-16.
A. V. Aho et al., "Code Generation for Expressions with Common Subexpressions", Journal of the Association for Computing Machinery, vol. 24, No. 7, Jan. 1997, pp. 146-160.
Christopher W. Fraser et al., "Engineering a Simple, Efficient Code-Generator Generator", ACM Letters Programming Languages and Systems, vol. 1, No. 3, Sep. 1992, pp. 213-226.
Kurt Keutzer, "DAGON: Technology Binding and Local Optimization by DAG Matching", AT&T Laboratories, $24^{th}$ ACM/IEEE Design Automation Conference, 1987, pp. 341-347.
Kubilay Atasu et al., "Automatic Application-Specific Instruction-Set Extensions under Microarchitectural Constraints", Proceeding of the $40^{th}$ conference on Design Automation, pp. 256-261, 2003.
Pekka Kilpelainen et al., "Ordered and Unordered Tree Inclusion", Society for Industrial and Applied Mathematics, 1995, pp. 340-356.

(Continued)

*Primary Examiner* — Loan T Nguyen
(74) *Attorney, Agent, or Firm* — Harrity & Harrity, LLP

(57) ABSTRACT

Embodiments relate to a system and method for identifying common patterns of use of resources. The resource usage patterns may be specified using a tree structure, and identifying common resource use patterns may involve identifying isomorphic subtrees between two or more trees. Isomorphic subtree identification may be accomplished by converting trees into key-based representation and analyzing the key-based representation to identify common patterns within the key-based representation.

25 Claims, 24 Drawing Sheets

OTHER PUBLICATIONS

Xiaotong Zhuang et al., "PerfDiff: A Framework for Performance Difference Analysis in a Virtual Machine Environment", Apr. 5-10, 2008, pp. 4-13.

Ron Shamir et al., "Faster Subtree Isomorphism", Department of Computer Science, May 1999, 16 pages.

Tatsuya Asai et al., "Efficient Substructure Discovery from Large Semi-structured Data", Department of Infomatics, Kyushu University, 2002, 17 pages.

Yun Chi et al., "Mining Closed and Maximal Frequent Subtrees from Databases of Labeled Rooted Trees", UCLA Computer Science Department Technical Report CSD-TR No. 040020, May 17, 2004, 29 pages.

Yun Chi et al. "Frequent Subtree Mining—An Overview", Department of Computer Science, University of California, 2001, pp. 1001-1038.

Gabriel Valiente, "Algorithms on Trees and Graphs", Springer-Verlag New York, Inc., Secaucus, NJ, Jul. 2002, 490 pages.

Alfred V. Aho et al., "The Design and Analysis of Computer Algorithms", Addison Wesley, Boston, MA, 1974, 470 pages.

Alfred V. Aho et al., "Compliers Principles, Techniques, and Tools", Addison-Wesley Longman Publishing Co. Inc., Boston, MA, 1986, 796 pages.

Steve S. Muchnick, "Advanced Compiler Design and Implementation", Morgan Kaufmann, 1997, 856 pages.

* cited by examiner

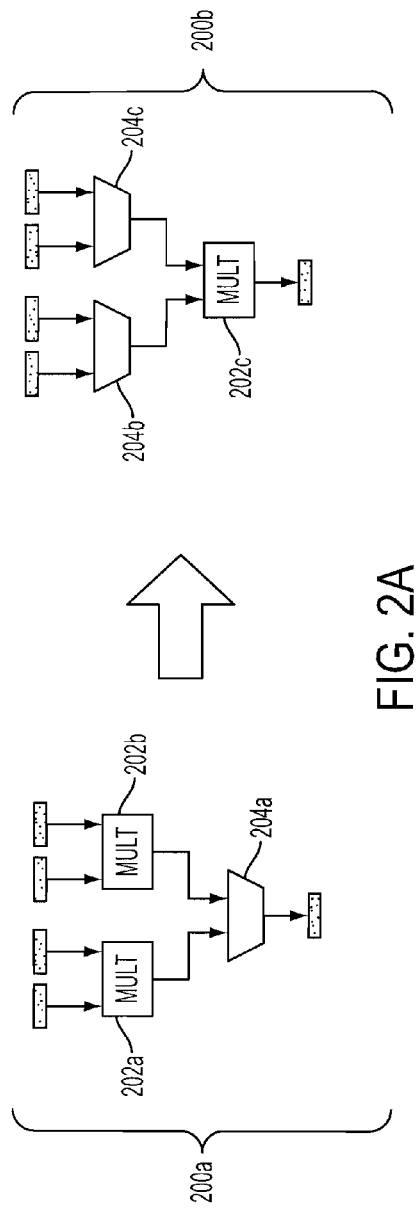
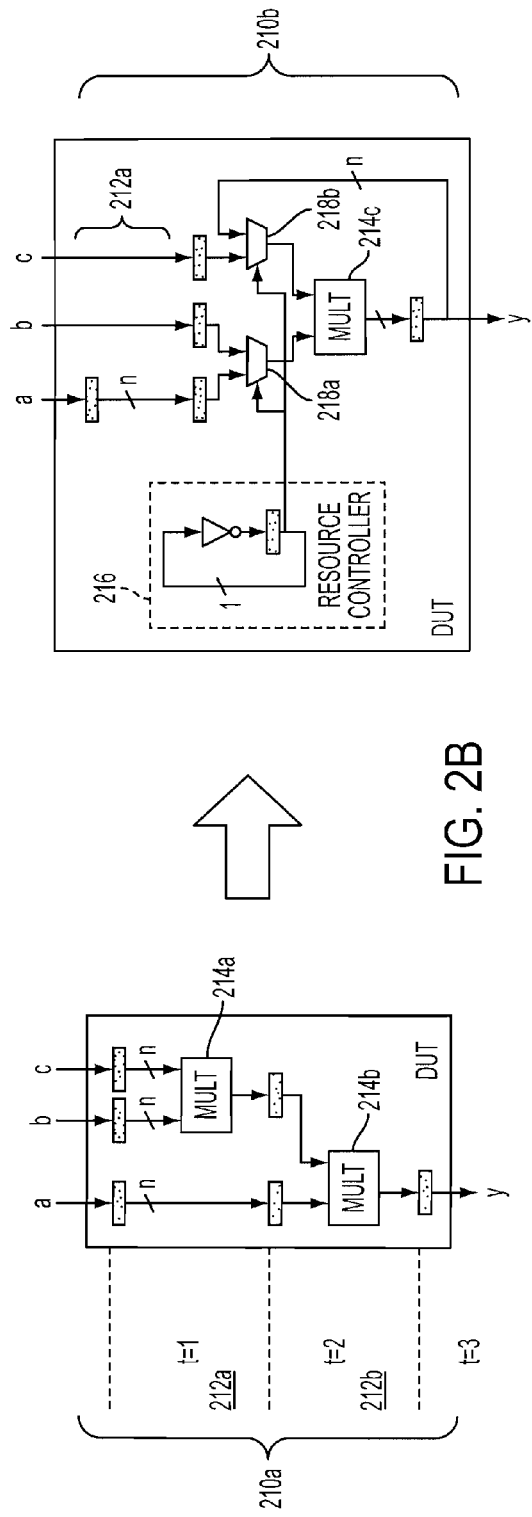
FIG. 2A
FIG. 2B

```
1:   if(cond > 1)            302a
2:      ⎧ t1 + a1 + b1;
3:      ⎪ in1 = t1;
3: 306 ⎨ in2 = c1;
4:      ⎪ in2 = c1;
5:      ⎩ in3 = d1;  304a
6:   else
7:      ⎧ t1 = a2 * b2;
8:      ⎪ in1 = t1;
8: 308 ⎨
9:      ⎪ in2 = c2;
10:     ⎩ in3 = d2;
11: end     302b/304b   302c/304c y = in1 + (in2 * in3);
```

FIG. 3C function y = fcn(cond1, a1, b1, c1, d1, a2, b2, c2, d2)
% This block supports the Embedded MATLAB subset.
% See the help menu for details.

if (cond1 > 1)
   y = (a1 + b1) + (c1 * d1); ~301
else
   y = (a2 * b2) + (c2 * d2); ~303
end

FIG. 3E

1002 — condition1 = $PS_1[p-1] = \text{'\$'}$
&& $PS_2[q-j+1..q-1] = OP$
1004 — condition2 = $PS_1[p-i+1..p-1] = OP$
&& $PS_2[q-1] = \text{'\$'}$
1006 — condition3 = $PS_1[p-i+1..p-1] = OP$
&& $PS_2[q-i+1..q-1] = OP$

FIG. 11A

1102 — $LCPSL(p, q) = \begin{cases} LCPSL(p-2, q-j) + 1 & \text{if condition1} \\ LCPSL(p-i, q-2) + 1 & \text{if condition2} \\ LCPSL(p-i, q-j) + 1 & \text{if condition3} \\ LCPSL(p-1, q-1) + 1 & \text{otherwise} \end{cases}$

FIG. 11B

1104 — $P\_PREV(p, q) = \begin{cases} p-2 & \text{if condition1} \\ p-i & \text{if condition2} \\ p-i & \text{if condition3} \\ p-1 & \text{otherwise} \end{cases}$ 1106 — $Q\_PREV(p, q) = \begin{cases} q-j & \text{if condition1} \\ q-2 & \text{if condition2} \\ q-j & \text{if condition3} \\ q-1 & \text{otherwise} \end{cases}$

FIG. 11C

CPSM(PS$_1$, PS$_2$) ⟵ 1202

1206 {
00: Create op_pos_table(PS$_1$)
01: Create op_pos_table(PS$_2$)
}
02: Reset LCPSL, ΔP_NEXT and ΔQ_NEXT
03: len$_1$ ⇐ length(PS$_1$)
04: len$_2$ ⇐ length(PS$_2$)
05: for(p=0 to len$_1$-1)
06:   for(q=0 to len$_2$-1)
07:     cond$_1$ ⇐ (PS$_1$[p]==PS$_2$[q])
08:     cond$_2$ ⇐ (PS$_1$[p - 1]=='$')
09:     cond$_3$ ⇐ (PS$_1$[p - 1]==')')
10:     cond$_4$ ⇐ (PS$_2$[q - 1]=='$')
11:     cond$_5$ ⇐ (PS$_2$[q - 1]==')')
12:     valid$_1$ ⇐ is_valid_op(PS$_1$)
13:     valid$_2$ ⇐ is_valid_op(PS$_2$)
14:     is_valid ⇐ valid$_1$&&valid$_2$
15:     if(cond$_3$)
16:       pos$_1$=get_op_pos(PS$_1$,p - 1,op_pos_table)
17:     endif
18:     if(cond$_5$)
19:       pos$_2$ ⇐ get_op_pos(PS$_2$,q - 1,op_pos_table)
20:     endif
21:     /*Populate solution matrices*/
22:     if(cond$_1$)
23:       if(p==0 || q==0)
24:         LCPSL(p,q) ⇐ 1
25:       else
26:         newLCPSL ⇐ LCPSL(p - 1,q - 1) + 1
27:         if(newLCPSL > 1 || is_valid)
1216a {
28:         LCPSL(p,q) ⇐ newLCPSL
29:         ΔP_NEXT(p - 1,q - 1) ⇐ 1
30:         ΔQ_NEXT(p - 1,q - 1) ⇐ 1
}
31:         endif
32:       endif
33:     endif

FROM FIG. 12A

```
34:    if(cond₁ && cond₃ && cond₄ && (pos₁ >0))
35:      newLCPSL ⇐ LCPSL(pos₁ - 1,q - 2) + 1)
36:      if(newLCPSL > LCPSL(p,q))
37:        LCPSL(p,q) ⇐ newLCPSL
38:        ΔP_NEXT(pos₁ - 1,q - 2) ⇐ p-pos₁ + 1
39:        ΔQ_NEXT(pos₁ - 1,q - 2) ⇐ 2
40:      endif
41:    endif
42:    if(cond₁ && cond₂ && cond₅ && (pos₂ >0))
43:      newLCPSL ⇐ LCPSL(p - 2,pos₂ - 1) + 1)
44:      if(newLCPSL > LCPSL(p,q))
45:        LCPSL(p,q) ⇐ newLCPSL
46:        ΔP_NEXT(p - 2,pos₂ - 1) ⇐ 2
47:        ΔQ_NEXT(p - 2,pos₂ - 1) ⇐ q-pos₂ + 1
48:      endif
49:    endif
50:    if(cond₁ && cond₃ && cond₅ && (pos₁ & pos₂ >0))
51:      newLCPSL ⇐ LCPSL(pos₁ - 1,pos₂ - 1) + 1)
52:      if(newLCPSL > LCPSL(p,q))
53:        LCPSL(p,q) ⇐ newLCPSL
54:        ΔP_NEXT(pos₁ - 1,pos₂ - 1) ⇐ p-pos₁ + 1
55:        ΔQ_NEXT(pos₁ - 1,pos₂ - 1) ⇐ q-pos₂ + 1
56:      endif
57:    endif
58:   endfor
59: endfor
```

FIG. 12B

|   |   | 0 . | 1 ( | 2 $ | 3 . | 4 * | 5 ( | 6 $ | 7 . | 8 $ | 9 ) | 10 ) |
|---|---|---|---|---|---|---|---|---|---|---|---|---|
| 0 | - | 1 | 0 | 0 | 0 | 0 | 0 | 0 | 0 | 0 | 0 | 0 |
| 1 | ( | 0 | 2 | 0 | 0 | 0 | 0 | 0 | 0 | 0 | 0 | 0 |
| 2 | * | 0 | 0 | 0 | 0 | 1 | 0 | 0 | 0 | 0 | 0 | 0 |
| 3 | ( | 0 | 0 | 0 | 0 | 0 | 2 | 0 | 0 | 0 | 0 | 0 |
| 4 | $ | 0 | 0 | 0 | 0 | 0 | 0 | 3 | 0 | 0 | 0 | 0 |
| 5 | . | 0 | 0 | 0 | 0 | 0 | 0 | 0 | 4 | 0 | 0 | 0 |
| 6 | $ | 0 | 0 | 0 | 0 | 0 | 0 | 0 | 0 | 5 | 0 | 0 |
| 7 | ) | 0 | 0 | 0 | 0 | 0 | 0 | 0 | 0 | 0 | 6 | 0 |
| 8 | . | 0 | 0 | 0 | 3 | 0 | 0 | 0 | 0 | 0 | 0 | 0 |
| 9 | + | 0 | 0 | 0 | 0 | 0 | 0 | 0 | 0 | 0 | 0 | 0 |
| 10 | ( | 0 | 0 | 0 | 0 | 0 | 0 | 0 | 0 | 0 | 0 | 0 |
| 11 | $ | 0 | 0 | 0 | 0 | 0 | 0 | 0 | 0 | 0 | 0 | 0 |
| 12 | . | 0 | 0 | 0 | 0 | 0 | 0 | 0 | 0 | 0 | 0 | 0 |
| 13 | $ | 0 | 0 | 0 | 0 | 0 | 0 | 0 | 0 | 0 | 0 | 0 |
| 14 | ) | 0 | 0 | 0 | 0 | 0 | 0 | 0 | 0 | 0 | 0 | 0 |
| 15 | ) | 0 | 0 | 0 | 0 | 0 | 0 | 0 | 0 | 0 | 0 | 4 |

LCPSL MATRIX

FIG. 14A

|   |   | 0 . | 1 ( | 2 $ | 3 . | 4 * | 5 ( | 6 $ | 7 . | 8 $ | 9 ) | 10 ) |
|---|---|---|---|---|---|---|---|---|---|---|---|---|
| 0 | - | 1,1 | - | - | - | - | - | - | - | - | - | - |
| 1 | ( | - | 8,3 | - | - | - | - | - | - | - | - | - |
| 2 | * | - | - | - | - | 3,5 | - | - | - | - | - | - |
| 3 | ( | - | - | - | - | - | 4,6 | - | - | - | - | - |
| 4 | $ | - | - | - | - | - | - | 5,7 | - | - | - | - |
| 5 | . | - | - | - | - | - | - | - | 6,8 | - | - | - |
| 6 | $ | - | - | - | - | - | - | - | - | 7,9 | - | - |
| 7 | ) | - | - | - | - | - | - | - | - | - | - | - |
| 8 | . | - | - | - | 15,10 | - | - | - | - | - | - | - |
| 9 | + | - | - | - | - | - | - | - | - | - | - | - |
| 10 | ( | - | - | - | - | - | - | - | - | - | - | - |
| 11 | $ | - | - | - | - | - | - | - | - | - | - | - |
| 12 | . | - | - | - | - | - | - | - | - | - | - | - |
| 13 | $ | - | - | - | - | - | - | - | - | - | - | - |
| 14 | ) | - | - | - | - | - | - | - | - | - | - | - |
| 15 | ) | - | - | - | - | - | - | - | - | - | - | - |

(P_NEXT, Q_NEXT) PAIR MATRIX

FIG. 14B

IDENTIFICATION OF RESOURCE SHARING PATTERNS THROUGH ISOMORPHIC SUBTREE ENUMERATION

BACKGROUND INFORMATION

Graphical and/or textual models are used in a multitude of areas of engineering and design to design, test and verify systems applicable to almost all fields of human endeavor, from biological systems, to mechanical and/or electrical systems, to finance and statistics applications. Model-based design typically involves representing a real-world system using a model, which model may then be tested, improved, and/or used to implement the actual system.

Logic or structure of a model or of any generic software and/or hardware program or module may be represented as a control flow graph (CFG). A CFG is a directed graph, in which nodes represent computational statements, elements or expressions, and edges represent transfer of control between nodes. A control flow typically includes all possible execution paths, and each possible execution path of the module has a corresponding path from the entry to the exit node of the graph. In general, a control flow graph is one of many possible representations of a software and/or hardware module and/or a real world system. The CFG may be an intermediate representation, derived from the original representation, or the software or graphical code itself may represent a control flow graph.

A control flow graph may be generated from a model by a modeling and/or high-level development tool. Such development tools may be general modeling environments or may be specifically tailored to a particular field of endeavor. A modeling tool may allow a user to create and edit a model, to execute it and/or to generate code from it.

Code generation may be done for simulation—that is, for executing and testing the model—or it may be a part of implementing a modeled system. The generated code may describe hardware and/or software implementations. A hardware implementation may be, for example, an electronic circuit. Modern day electronic circuits may be described using a hardware description language (HDL).

"HDL" refers to any language from a class of computer languages for formal description of hardware. It can describe hardware operation, its design, and tests to verify its operation by means of simulation. HDL provides a standard text-based expression of the temporal behavior and/or spatial structure of the hardware. The syntax and semantics of an HDL include explicit notations for expressing time and concurrency, which are primary attributes of hardware.

Using the hardware description in HDL code, a software program called an HDL synthesis tool can infer hardware logic operations from the hardware description statements and produce an equivalent list of generic hardware primitives to implement the specified behavior. In such a way, a textual and/or graphical model of a real-world system and/or a CFG representing the real world system may be automatically transformed into an implemented version of the real-world system or some of its parts.

BRIEF DESCRIPTION OF THE DRAWINGS

FIGS. 2A-B illustrate combinatorial and sequential hardware resource sharing;

FIGS. 3A-G illustrate resource sharing where multiple resources are shared in the same pattern and different models that may contain such a pattern;

FIGS. 11A-C form a description of conditions for subtree matching and corresponding entries in dynamic programming matrices;

FIGS. 12A and 12B are an illustration of pseudocode for a dynamic programming process for common prefix substring matching according to embodiments described herein;

FIGS. 14A-B show solution matrices from the CPSM processing on the two trees of FIG. 8;

DETAILED DESCRIPTION

Briefly, embodiments relate to a system and method for identifying common patterns of use of resources. The resource usage patterns may be specified using a tree structure, and identifying common resource use patterns may involve identifying isomorphic subtrees between two or more trees. The two trees may themselves be subtrees of the same tree.

Engineers and scientist often represent different problems and real-world systems in terms of graphs or trees, with nodes representing elements of the system or relationships between different elements. A tree is an acyclic directed connected graph. A tree contains one or more nodes and connections between the nodes. The connections are called branches and relationship between connected nodes may be described as "parent" and "child." A node without any children is called a leaf.

Trees may be used to represent any number of real world systems or structures, including any number of types of resource usage scenarios. In addition, a tree may serve as an intermediate representation (IR) of a model. In many applications, there may be a need to find topologically identical segments within one or more trees. Such topological isomorphism may be applicable in a variety of different areas of engineering, science and other endeavors.

If a tree is used to represent a pattern or resource usage, finding isomorphic subtrees within different expression trees may help identify common resources and patterns of resource usage among those expression trees, thus leading to possible system design with an eye towards resource reuse. By way of example, a tree may represent a pattern of hardware computational resource usage, and finding isomorphic subtrees may point to common computational resources that can be shared. In an embodiment, a user may create a model of a hardware system including one or more hardware computational resources. A modeling environment may then automatically convert the user's model to an internal tree-based representation, in which various nodes may represent different hardware computational resources. Edges of the tree-based representation may represent data and/or control flow between the nodes. A further analysis may reveal two or more isomorphic subtrees within this internal representation, thus identifying computational hardware resources that may be shared among different branches of the tree. The system may proceed to generate a hardware description code (HDL) corresponding to the model, in which some optimizations may have been performed based on the identified shared resource usage patterns. In such a way, while the generated HDL may functionally correspond to the model, its various aspects may be optimized as compared to the original model. Those aspects may be propagated back to the model.

Computer System for Implementing an Embodiment

Figure 1:
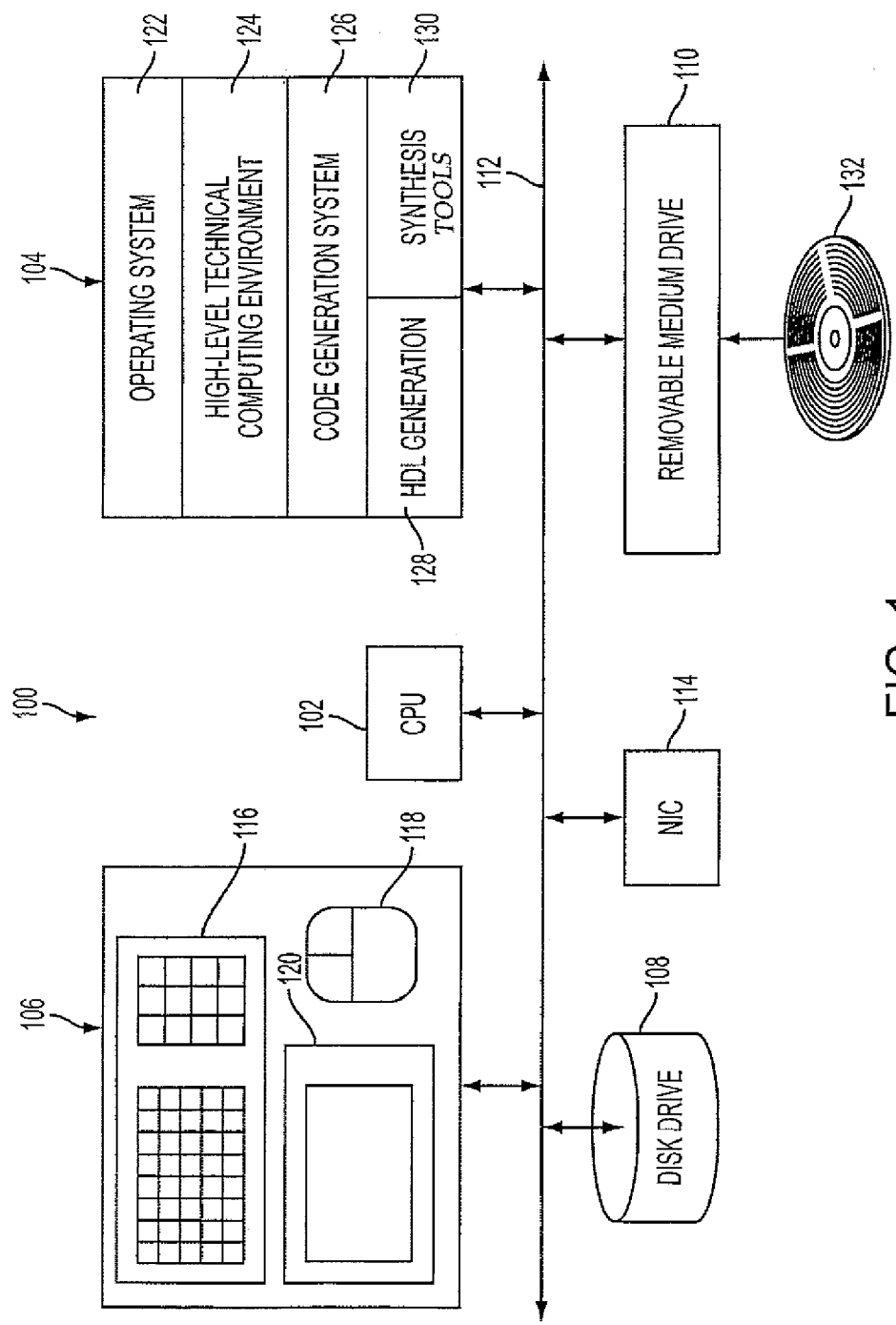
FIG. 1 is a schematic illustration of a computer system 100 for implementing and utilizing an embodiment.

FIG. 1 is a highly schematic illustration of a computer system 100 for implementing and utilizing an embodiment of the invention. The computer system 100 includes a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 includes a keyboard 116, a mouse 118 and a display 120.

The main memory 104 stores a plurality of libraries or modules, such as an operating system 122, and a high-level technical computing environment 124. The main memory 104 may also include a code generation system 126. The code generation system 126 may be configured as a toolbox or an add-on product to the high-level technical computing environment 124. Furthermore, stored in the main memory 104 there may be tools 128 to generate Hardware Description Language (HDL) code and/or tools 130 to synthesize hardware layout from the HDL code or from a model stored in the high-level technical computing environment 124.

The removable medium drive 110 is configured to accept and read a computer readable medium 132, such as a CD, DVD, floppy disk, flash memory or other medium. The removable medium drive 110 may further be configured to write to the computer readable medium 130.

Suitable computer systems include personal computers (PCs), workstations, servers, laptops, and palm computers. Nonetheless, those skilled in the art will understand that the computer system 100 of FIG. 1 is meant for illustrative purposes only and that the present invention may be used with other computer systems, processing systems or computational devices. The present invention may also be used in a network, e.g., client-server, computer architecture.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 116, the mouse 118 and the computer display 120 of the user I/O 106 to operate the high-level technical computing environment 124, and generate code.

Suitable high-level technical computing environments for use with the present invention include the MATLAB® and SIMULINK® technical computing environments from The MathWorks, Inc. of Natick, Mass. With the MATLAB® technical computing environment, a user may create models using a textual representation. With the Simulink® technical computing environment, a user creates a graphical model by dragging and dropping blocks from a library browser onto a graphical editor, and connecting them with lines that correspond to mathematical relationships and/or data flow between the blocks. There are other high-level development tools, including tools that are extensions of or work in conjunction with the MATLAB® and Simulink® technical computing environments. Such complementing tools may include Stateflow modeling environment, Simbiology modeling environment and others. Stateflow is an extension to the Simulink® technical computing environment that allows users to specify state machines and flow charts. A Stateflow chart may be created by dragging states, junctions and functions from a graphical palette into a drawing window. The user can then create transitions and flow by connecting states and junctions together.

Other suitable high-level technical computing environments may include the LabVIEW programming system from National Instruments Corp. of Austin, Tex., the Visual Engineering Environment (VEE) from Agilent Technologies, Inc. of Santa Clara, Calif., the Khoros development system now from AccuSoft Corp. of Northborough, Mass., a C programming system, a JAVA programming system, a C++ programming systems, and a Unified Modeling Language (UML) environment, among others. Those skilled in the art will recognize that the computer system 100 need not include any software development environment at all.

A high-level technical computing environment may include capability to generate code from a model. Such capability may be provided in the technical computing environment itself or by add-on or stand-alone software products.

In addition, present on the computer system 100 there may be synthesis tools that convert an HDL description of a system into a more low-level specification of a hardware system. Specifically, a Simulink Hardware Description Language (HDL) Coder add-on product, also available from The Math Works, Inc., is an HDL synthesis tool that generates HDL code based on Simulink models or Stateflow charts. The generated HDL code can be exported to synthesis and layout tools for hardware realization, such as Field Programmable Gate Arrays (FPGAs), Application Specific Integrated Circuits (ASICs), Complex Programmable Logic Devices (CPLDs), etc. The Simulink HDL Coder and the Simulink technical computing environment may be used for electronic design automation. Other add-on products or tools exist for generating code from Simulink models, MATLAB files, often referred to as M-files, and/or Stateflow charts.

With the Simulink HDL Coder add-on product, a user may create a code generation control file that is attached to a model. The control file allows the user to set code generation options, such as how HDL code is generated for selected sets of blocks within the model. In this way, the generated HDL code may be optimized for speed, chip area, latency, etc., based on various design considerations.

Resource Sharing in HDL Code Generation

Resource sharing is relevant to design considerations that a system designer may encounter when designing or optimizing a hardware system. There are usually trade offs between speed of the system (or delay encountered in the system), throughput of the system and/or the area of the system. These trade-offs form a design space that is available for exploration during system design and/or HDL code generation.

Introducing resource sharing into a system may affect design quality. If each operation in a design is allocated a dedicated resource, then resource sharing may exploit the parallelism offered in that arrangement. However, exploiting the parallelism may bring about repercussions in terms of system speed or throughput, and a designer may take into account various considerations when deciding how to take advantage of the opportunities for resource sharing. The following are some of the reasons why a system designer may want to consider resource sharing:

Available on-chip resources may be limited. In order to fit a design on a given field programmable gate array (FPGA) area, resource sharing may be needed. The resource sharing may be especially beneficial when the design being synthesized by the HDL generation tool is only a small part of a bigger whole. In this case, the designer may pre-allocate or budget no-chip resources for each subsystem in the design.

A design may be inherently mostly sequential and may not exhibit much parallelism. For efficiency reasons, a resource-shared implementation may be preferred in this case.

Memory synthesis and serialization may pose challenges. Inability to efficiently synthesize designs that operate on large sets of matcices, vectors and/or frames may pose a bottleneck to scalability. A frame is a temporal collection of data samples sampled over time. In some cases, being able to process matrices of data may involve matrix flattening or exploration, which may result in in the synthesized hardware that treats each matrix element as a scalar. This approach may be suboptimal in cases of particularly large designs or matrix sizes. Input/Output (I/O) ports, which may be needed for such an approach, may also be a limited resource unless a sharing scheme is used. In an embodiment, an approach to memory synthesis may involve synthesizing a RAM to store a working set of matrices and scheduling computation in parallel on matrix data that is streaming in and out. This approach may be a form of resource sharing.

These design decisions are not limited to a particular design style or design methodology and may be encountered in different aspects of hardware system design. Resource sharing relating to computational resources and/or computational units, may be combinatorial and/or sequential. A computational resource or a unit may be a hardware logic computing resource, such as a gate, a register, or a field programmable gate array (FPGA) cell, or a higher-level computing resource, such as an arithmetic logic unit (ALU), a processor, a computer etc. A computational resource may be made up of one or more other computational resources.

FIGS. 2A and 2B illustrate combinatorial and sequential hardware resource sharing. Shown in FIG. 2A is an example of combinatorial resource sharing. In system 200a, the same resource—multipliers 202a and 202b—are used along different control paths of a given combinatorial logic subgraph. As shown in system 200a, the control paths are mutually exclusive (e.g., as if they are different branches of an if-else statement), and thus at the end the result of only one of those computation is needed, as selected by multiplexer 204a. In this case, the more expensive resource—a multiplier—may be shared by moving the multiplexer to the resource's inputs, as shown in system 200b.

In system 200b, a determination of which inputs are to be used is made in advance of the computation, at multiplexers 204b and 204c, and the appropriate inputs are passed to multiplier 202c. In an embodiment where multiplexors are cheaper and/or smaller than multipliers, the implementation of system 200b may be preferable to that of system 200a. Combinatorial resource sharing typically does not affect the timing of the Design Under Test (DUT), because it is usually a logic optimization.

Illustrated in FIG. 2B is an example of sequential resource sharing. In the sequential resource sharing scenario, resources may be shared across different time steps of a synchronous schedule. As shown, system 210a includes two multipliers (214a and 214b), where multiplier 214b uses the result of the computation of multiplier 214a. System 210a has multiple pipeline stages, including stages 212a and 212b, in which computation at multipliers 214a and 214b takes place, respectively.

System 210b is functionally equivalent to system 210a in that it carries out the same computations. However, in system 210b, there is only one multiplier 214c, the input to which is supplied from multiplexers 218a and 218b and a resource controller 216 that has been introduced in order to make possible resource sharing among different pipeline stages. Resource controller 216 determines which inputs are granted access to the shared resource. Resource controller may be implemented as a counter and/or as a state machine that tracks time or a number of pipeline stages to determine what inputs must proceed to the resource.

The trade-offs in sequential resource sharing may be more complex to calculate than in combinatorial resource sharing. For example, in FIG. 2b, in terms of area, two n-bit multiplexors have been introduced, as well as resource controller 216, which consists of an inverter and a 1-bit register, while a single multiplier and an n-bit register have been eliminated. Depending on the resource that is shared, such a trade-off may or may not be favorable, as determined by one of skill in the art. Additionally, there may also be a performance penalty in sequential resource sharing. While the critical path may remain unchanged in combinatorial resource sharing, it is often increased in systems with sequential resource sharing, which may result in increased routing delays or wire loads. Finally, there may also be a penalty in terms of pipelining.

For example, system 210a may sustain a throughput of 1 output per clock cycle. In other words, it can stream in inputs every cycle and produce an output every cycle. In steady state, both multipliers 214a and 214b are kept busy because they are operating on different input datasets. With sequential resource sharing, however, this capability of outputting an output every cycle may be lost, as is illustrated in system 210b, which can only support an input rate of one input every two cycles and one output every two cycles. In general, if a resource is shared amongst k operations in a specification, then the DUT may only support a maximum input data rate of 1/k samples per cycle.

The benefit of sequential resource-sharing may be in its potential. Any resources that is used in multiple time steps of a given synchronous schedule may be a candidate for sequential resource sharing. Additionally, sequential resource sharing may be needed for memory synthesis, serialization and streaming computation. In an embodiment, it may be possible to share an entire body of a loop iteration. Thus, instead of synthesizing a fully unrolled implementation of, for example, "for" loops, it may be possible to share the hardware implementing the loop body across iterations. Thus, the possibilities and applications of sequential resource sharing may be many.

Despite possible advantages and disadvantages of each of the type of resource sharing, both combinatorial and sequential resource sharing may be of use in designing hardware systems. A potential system may be represented as an expression execution tree and/or graph, which may then be then processed to locate matching subgraphs that correspond to potential resource sharing arrangements. Potential resource sharing arrangements may be found, for example, in mutually exclusive sections of an expression tree. Sharing more than one computational resource—that is, elements corresponding to more than one node—may yield a greater area savings than sharing at a node or an operation level granularity.

A control flow graph and/or an execution expression graph are examples of a representation of resource usage patterns. In order to capitalize on resource sharing, an embodiment employs a process for mining execution graphs in mutually exclusive sections to discover isomorphic execution subgraphs in these sections, from which sharable resources may be inferred. Sharing the entire sub-graph or its portion may have an effect of sharing not only the execution units, represented by nodes in the execution graph, but also the communication structures (wires, channels, etc.) as represented by the edges in the graph. In an embodiment, a graph representing resource use patterns may be converted to a tree representing resource use patterns. The tree representing the resource use patterns may then be analyzed to locate possibilities for resource sharing.

Figure 3A:
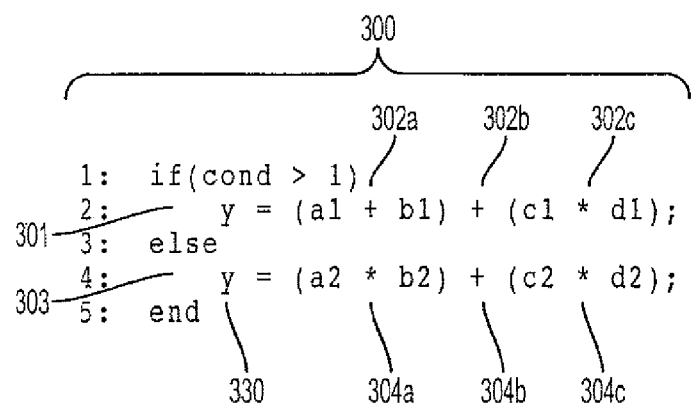
Figure 3B:
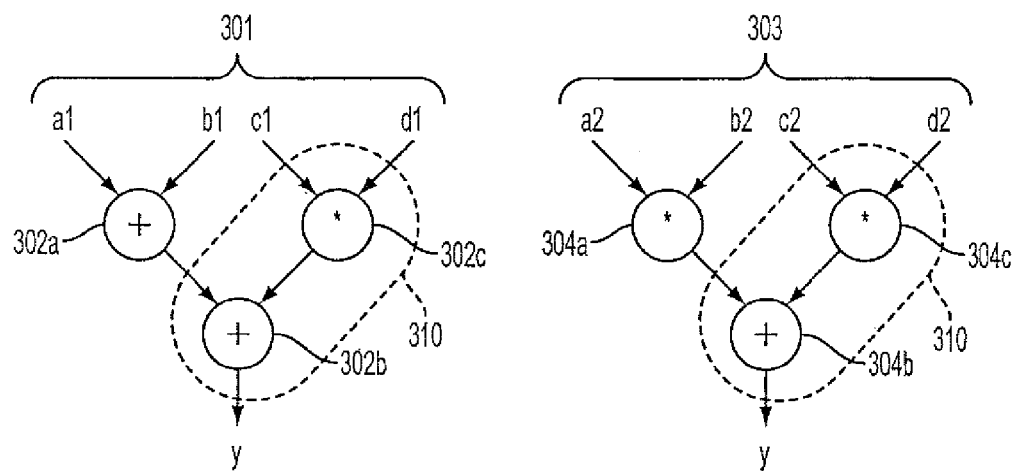

FIGS. 3A-C illustrate resource sharing where multiple resources are shared in the same pattern. FIG. 3A is an example of system 300 that includes two mutually exclusive branches, 301 and 303, formed by different sides of the condition statement at line 1. Each of branches 301 and 303 uses three computational resources: resources 302a-c and 304a-c, respectively. The number of resources used at two or more mutually exclusive branches need not be the same. Although as shown, system 300 is described using textual programming code, it should be understood that such description is given here for illustration purposes only, and a system or a model or a system may be generated by a user using graphical and/or textual elements. Shown in FIG. 3A as code is a functional description of system 300.

FIG. 3B is an illustration of trees or subtrees that may represent branches 301 and 303. Once again, each of the branches has three computational elements, shown with their respective inputs. Although the inputs are different in branches 301 and 303, there is a pattern of resource use that is common among both branches (pattern 310). In generating HDL and/or synthesizing hardware, it may be useful to have only one repetition of this pattern, keeping the functionality of the original system through the use of multiplexors, registers, or other resource sharing aids. Such potential sharing is illustrated once again textually in FIG. 3C, where each of the branches has only one computation (302a and 304a, respectively) and additional resource sharing arrangements 306 and 308 are added to ensure that computational resources 302b/304b and 302c/304c are replicated only once. This new arrangement may be useful in reducing the area and/or cost of the hardware implementation of system 300 while preserving the functionality of system 300.

Figure 3D:
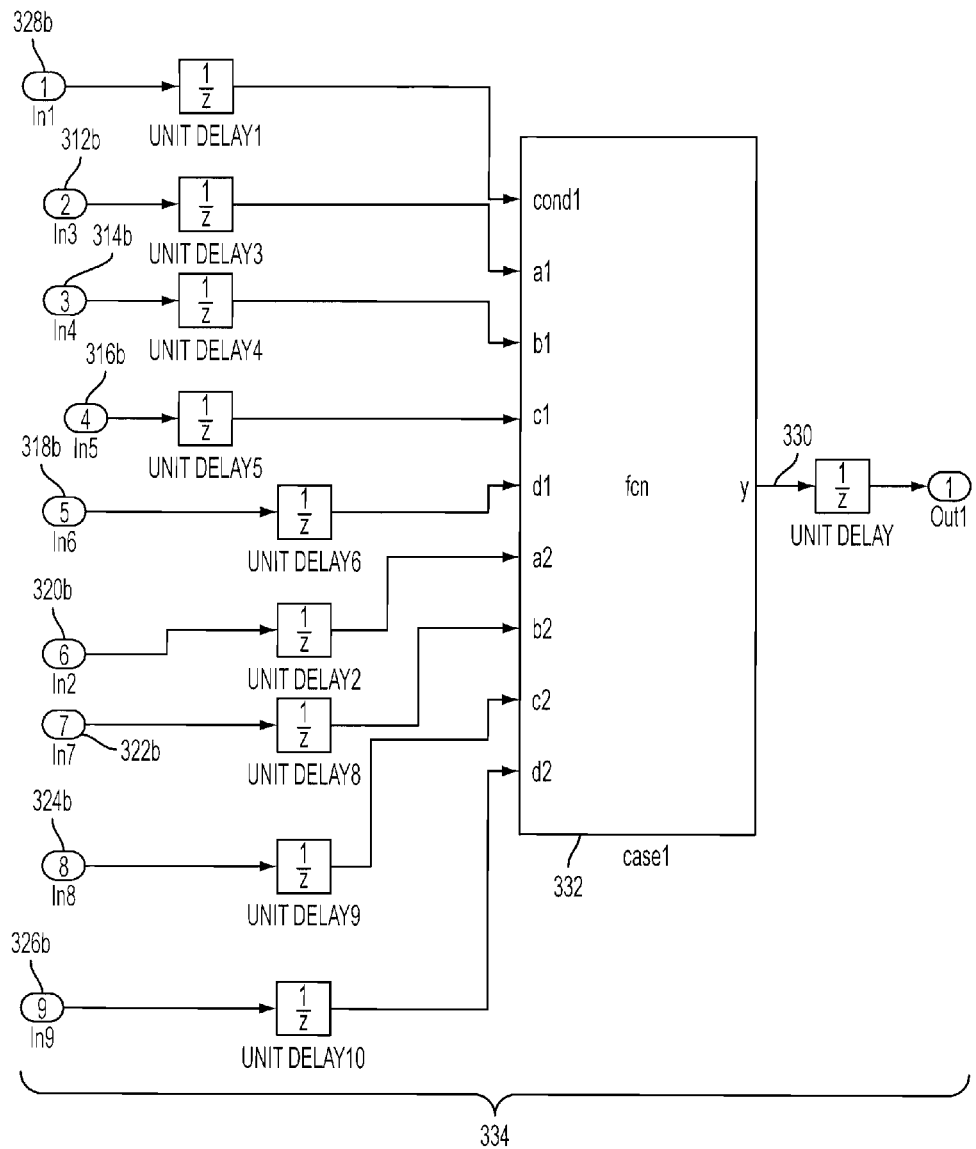
Figure 3F:
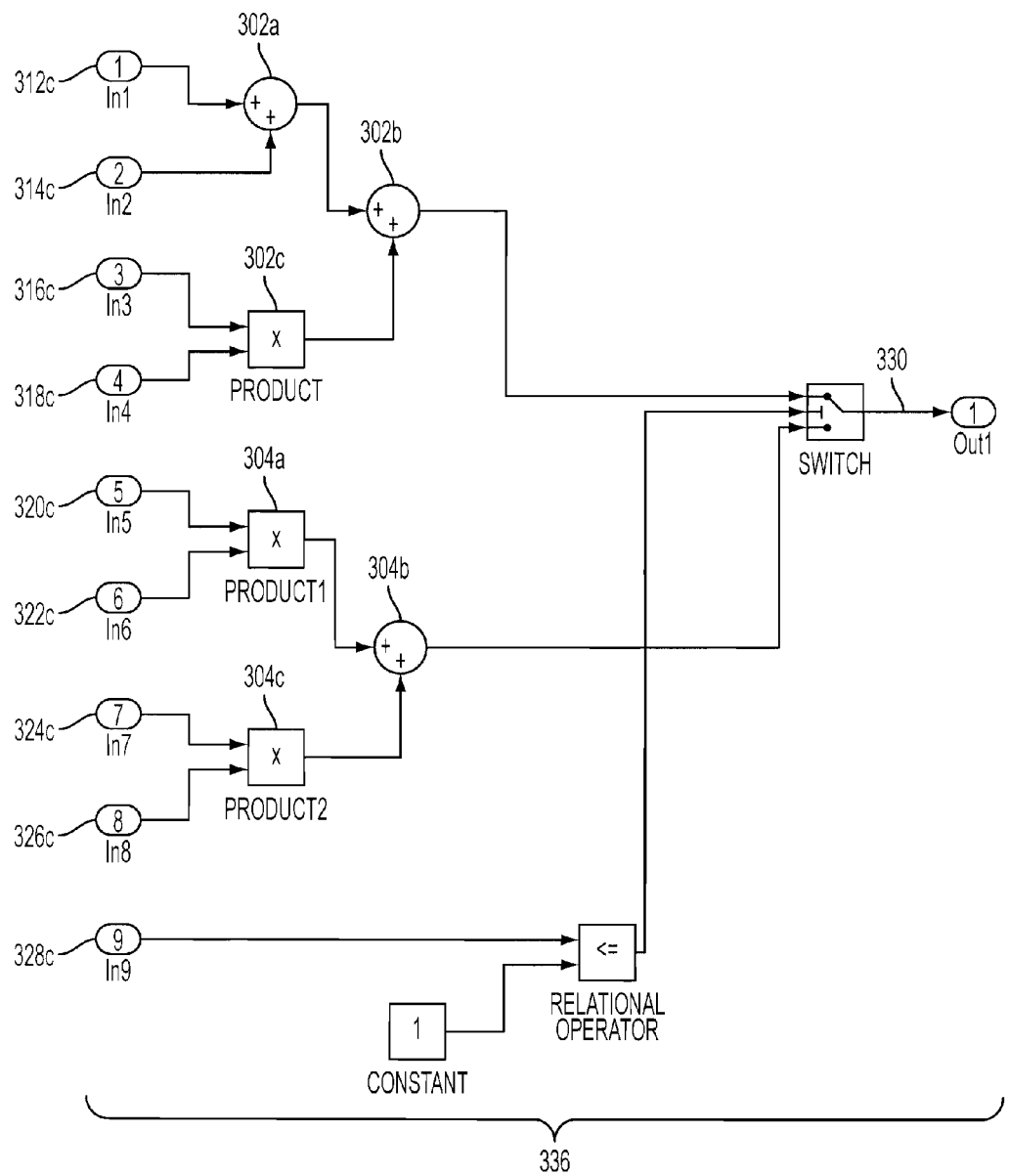

System 300 may be represented in a multiple different ways. It may be an intermediate representation of a model in a modeling environment. The model may be a time-based dynamic model and/or an event-based model. The model may be a graphical and/or textual. Illustrated in FIGS. 3D-F are different models from various modeling domains. These models have resource use patterns that may be represented as shown in system 300.

FIGS. 3D-E illustrate a portion of a graphical block diagram model 334 having nine inputs (312b-328b). Inside model 334, there is a block 332 containing a textual representation of its functionality. The functional description of the functionality of block 332 is shown in FIG. 3E. Put together, model 334 may generate output 330 corresponding to output 330 illustrated in FIGS. 3A-C. The resource sharing arrangement from FIG. 3C may be propagated to amend model 334. Model 334 may be a Simulink® model.

FIG. 3F illustrates a portion graphical block diagram model 336, whose internal representation may once again be represented in the same way as system 300. Model 336 has nine inputs (312c-328c), adders 302a-b and 304b and multipliers 302c, 304a, and 304c, arranged as shown to produce result 330. Model 336 may also be a Simulink® model.

Figure 3G:
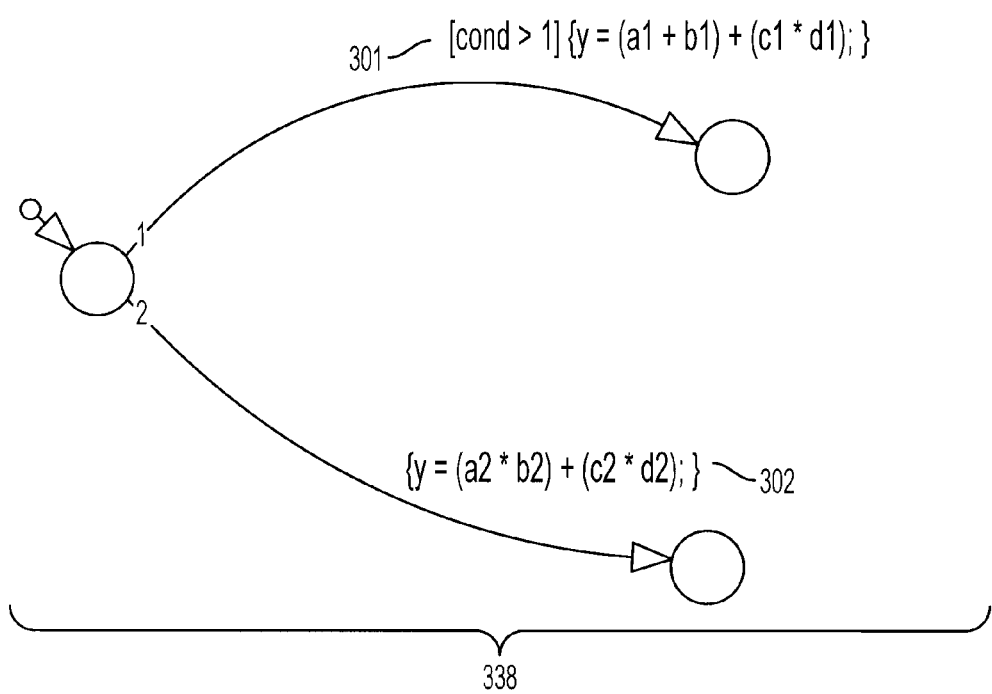

Similarly, FIG. 3G illustrates a portion of an event-based model 338, whose internal representation may also be represented in the same way as system 300. In model 338, computation of the output may occur during transition between junctions. Model 338 may be a Stateflow model.

In general, an expression subtree is a sharable resource if the same computation pattern, represented by the subtree, is found in different parts of the application's execution graph. If the locations where the isomorphic subtrees are found exist in mutually exclusive control regions within the same pipeline step, then the resource is a candidate for combinatorial resource sharing. On the other hand, if the subtrees are found in different pipeline stages, then it is a candidate for sequential resource sharing.

Resource Sharing and Isomorphic Subtree Matching

In an embodiment, possibilities for resource sharing may be located through representing resource use patterns as trees and locating isomorphic subtrees. Although resource sharing has been illustrated thus far primarily with reference to hardware resource sharing in HDL generation and/or hardware synthesis, the resource sharing system and methods of an embodiment are not limited to HDL applications. Systems and methods described herein for possible resource sharing patterns identification may be applicable across a broad range of engineering, scientific and other applications, so long as patterns of resource usage or system design may be expressed as a graph and/or a tree. Two subgraphs of a given set of graphs may be said to be isomorphic when there is a one-to-one correspondence between their nodes and edges in terms of some chosen attributes. In order to facilitate identification of isomorphic sections, graphs may be transformed into trees by replicating nodes having multiple fan-outs.

Figure 4A:
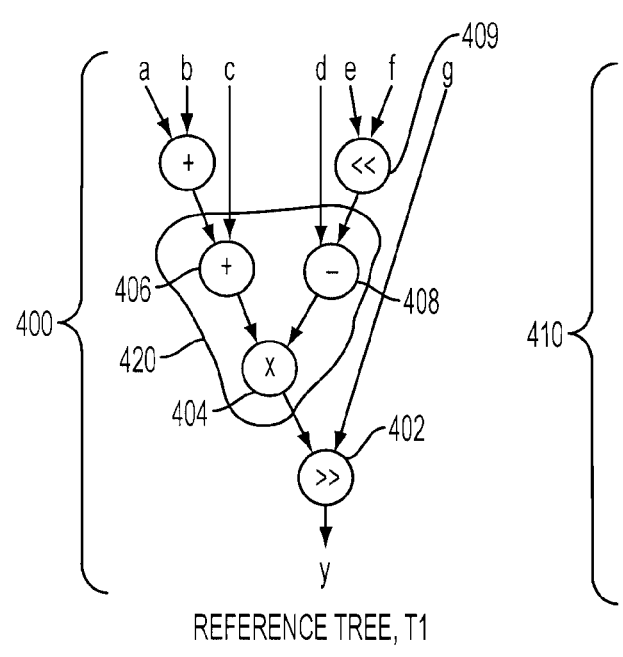
FIGS. 4A-B illustrate another example of resource use pattern trees and their isomorphic subtrees.
Figure 4B:
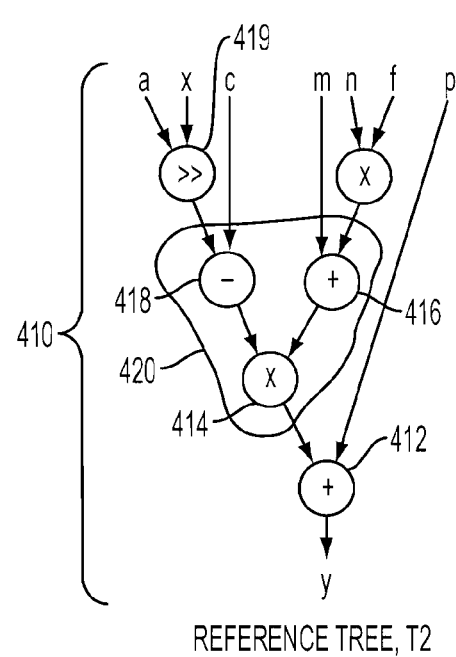

FIGS. 4A-B illustrate another example of resource use pattern trees and their isomorphic subtrees. Shown are two trees, reference tree T1 400 with root at node 402 and reference tree T2 410 with root at node 412. A possible isomorphic match between the two trees is illustrated in area 420. As can be seen from FIGS. 4A-B the two subtrees are not necessarily topologically identical. Some nodes in a tree may be ordered, representing an operation or an action that produces a different output depending on the order of its inputs. For example, nodes 409 and 419 are ordered nodes, and changing the order of their inputs may affect the overall system. Other nodes, such as nodes 406, 408, 404, 418, 416, and 414 are unordered, meaning that their inputs may be reordered without affecting the overall functionality of the system represented by the tree.

The process of identifying isomorphic subtrees may need to take into account the order or lack thereof at each node. It should be noted that although the ordered/unordered nodes have been shown in FIGS. 4A-B in respect to mathematical operations that are not commutative or commutative, in different embodiments, there may be a different notion of what constitutes an ordered node or not. Nodes need not represent computational resources performing mathematical calculations, and order may be defined based on the type of the node or the type of the resource that it represents, as will be applicable to a particular embodiment. Some trees may have only ordered nodes, some trees may have only unordered nodes, and in some cases, as those that are illustrated herein, a tree may have both ordered and unordered nodes.

A common subtree match may exist anywhere in the two reference trees. A match need not contain a root node or leaf nodes. Illustrated in FIGS. 4A-B is a match that is "internal"—that is, it does not include either root node or any of the leaf nodes. Matches may be located such that they contain root and/or leaves in one tree and do not contain them in the other tree being matched. Some of the existing subtree isomorphism problems define a match only if the matched subtrees share the same root with the reference trees or the matched subtrees share all their leaves with the reference trees. These limited approaches may include value numbering approaches and others. In an alternative embodiment, such approaches may be employed to aid in solving resource sharing problems as well, however, the process that is capable of locating all of the isomorphic subtrees, regardless of where they are located in two reference trees, may be preferable for resource sharing possibilities identification, because in real world systems resources to be shared need not be only in the beginning or the end of a resource use path.

A control flow graph may be represented as a tree. A tree may be viewed as a directed acyclic graph $T=(V,E,r, \text{type})$, with a set of nodes/vertices V, a set of edges $E \subset V \times V$, and a root node, $r \in V$, such that all nodes except the root have exactly one parent. Every node has a specific type given by the mapping, type: $V \to \mu$. The direction of the edges is from leaves to root. The node sets, $\text{In}(v)$ and $\text{Out}(v)$, define the inputs and outputs of a given node. The tree invariants are given by: $\forall v, \text{s.t.}, v \neq r, |\text{Out}(v)|=1$ and for the root node, $|\text{Out}(r)|=0$.

If the children of a node can be interchanged, then the node may be considered to be unordered. Conversely, an ordered node, v, imposes a left-to-right sequencing of its children, given by $\text{Child}(v)=<u_1, \ldots, u_n>$, where $\forall 1 \leq i \leq n, u_i \in \text{In}(v)$. Whether or not a node is ordered is determined by its type and is given by the mapping Order: $\mu \to \{0, 1\}$.

If a tree or a graph of a particular application does not conform to the rules specified above, it can be transformed into a conforming tree using techniques known to one of skill in the art. A tree need not be a binary tree, although in some embodiments a non-binary tree may first be transformed into a binary tree.

By way of an example, a tree in a compiler's intermediate representation may be an expression tree with some functional operations as nodes and the root, r computing the final result. The set, $\mu$, represents all the operations performed by a program. Thus, type(v) may specify the operation encapsulated by v. An unordered node maps to commutative operations, while ordered nodes are non-commutative.

Without loss of generality, it may be possible to add pseudo leaf nodes to the trees under consideration. This may be appropriate in dealing with expression trees where nodes are operations and are typically associated with some inputs. The pseudo leaf nodes represent a terminal input, e.g., a variable or constant, that is typically supplied as input to the expression tree. In an embodiment, it may be assumed that every leaf of a tree is a pseudo node, $v_p$, such that $\text{In}(v_p)=0$ and $\text{type}(v_p)=\$$, i.e., the type of a pseudo node is considered to be a special alphabet, $. The nonpseudo nodes have children (inputs) associated with them. In embodiments, trees without pseudonodes may be rewritten in the form specified above, or the process of subtree matching need not operate only on the trees in the form specified above. Also, pseudonodes may be described in any way appropriate for a particular implementation, not only as including characters from a special alphabet. There may be applications where inputs matter to the computation performed at the node, and in those applications inputs may also be represented as additional nodes, or the process of subtree matching may be adapted to take into consideration the specifics of the tree representations.

It may be said that two trees, $T_1=(V_1,E_1, r_1, \text{type}_1)$ and $T_2=(V_2,E_2, r_2, \text{type}_2)$, are isomorphic or topologically equivalent, if there exists a relation, $\tau: V_1 \to V_2$, between $T_1$ and $T_2$, which satisfies the following conditions:

1. $\tau$ $^{bijective, i.e., for\ \forall u,v \in V}{}_1$, $u \neq v \to \tau(u) \neq \tau(v)$, and $\forall v' \in V_2$, 
$\exists v \in V_1, \text{s.t.}, \tau(v)=v'$.

2. $\tau$ preserves the edge relations, i.e., for $(u,v) \in E_1$, there exists $(\tau(u), \tau(v)) \in E_2$.

3. $\tau$ preserves the types, i.e., for $v \in V_1$, $\text{type}_1(v)=\text{type}_2(\tau(v))$.

4. For every ordered node, $v \in V_1$, the ordering relation is preserved, i.e., if $\text{Child}(v)=<u_1, \ldots, u_n>$, then $\text{Child}(\tau(v))=<\tau(u_1), \ldots, \tau(u_n)>$.

A subtree, $S=(V_s, E_s, r_s, \text{type})$ of a tree, $T=(V,E, r, \text{type})$, is a tree that contains a subset of the nodes of T and preserves the edge, type and ordering relations. In other words, $V_s \subset V$, both trees share the same type mapping, the edge relations in E are preserved in $E_s$ and the ordering relations in T are preserved in S. Further, S is a maximal subtree if and only if $\text{Leaves}(S) \subset \text{Leaves}(T)$. It follows that for every node, u, in the tree, there exists a unique maximal subtree rooted at u. This mapping from a given tree node, u, in T to its maximal subtree may be referred to as $\text{MaxSubtree}(u)$.

The problem of locating isomorphic subtrees may be described as following: given two trees, $T_1=(V_1,E_1, r_1, \text{type}_1)$ and $T_2=(V_2,E_2, r_2, \text{type}_2)$, find the set of all isomorphic subtrees contained within these two trees. If $T_1^*$ and $T_2^*$ are the domains of all subtrees contained in $T_1$ and $T_2$ respectively, then the goal of the problem is to find the exhaustive set of subtree isomporphs, $ST1 \subseteq T_1^* \times T_2^*$, that satisfies the following conditions:

1. Every member is a pair of isomorphs: $\forall (S_1,S_2) \in ST1$, the subtrees $S_1 \in S T_1^*$ and $S_2 \in S T_2^*$ are isomorphic; and
2. If a subtree pair is not a member of ST1, then they are not isomorphic, i.e., $\forall (S_1 \in ST_1^*, S_2 \in S T_2^*) \notin ST1$, the subtrees $S_1$ and $S_2$ violate some condition for isomorphism from above and are therefore not isomorphic In order to facilitate resource sharing, an embodiment may attempt to find the largest possible matches. That is, a matching subtree may encapsulate a number of smaller matching subtrees. A matching subtree that is not itself encapsulated in any other matching subtrees may be referred to as a maximal isomorph.

Given two reference trees, $T_1$ and $T_2$, let the domains, $T_1^*$ and $T_2^*$ represent all subtrees contained within these trees, respectively. A maximal isomorph is a pair of subtrees, $(S_1 \in ST_1^*, S_2 \in S T_2^*)$, that satisfy the following conditions:
1. $S_1$ and $S_2$ are isomorphic
2. $S_1$ and $S_2$ are not subtrees of any other pair of isomorphic subtrees in the $T_1^* \times T_2^*$ space. This means that there does not exist ($R_1 \in ST_1^*, R_2 \in S T_2^*$), such that: (a) $S_1$ is a subtree of $R_1$, and (b) $S_2$ is a subtree of $R_2$, and (c) $R_1$ and $R_2$ are isomorphic.

Identifying maximal isomorphs may identify maximal groups of resources that may be shared. Alternatively, it may be easier to select any subgroup of resources from the maximal isomorphs, because for any two isomorphs all of their subtrees will be isomorphic as well. In such a way, a task of locating shareable resources may be accomplished by way of locating all or a subset of maximal isomorphs in tree-based representations of resource use patterns.

Systems and Methods for Subtree Matching

Figure 5:
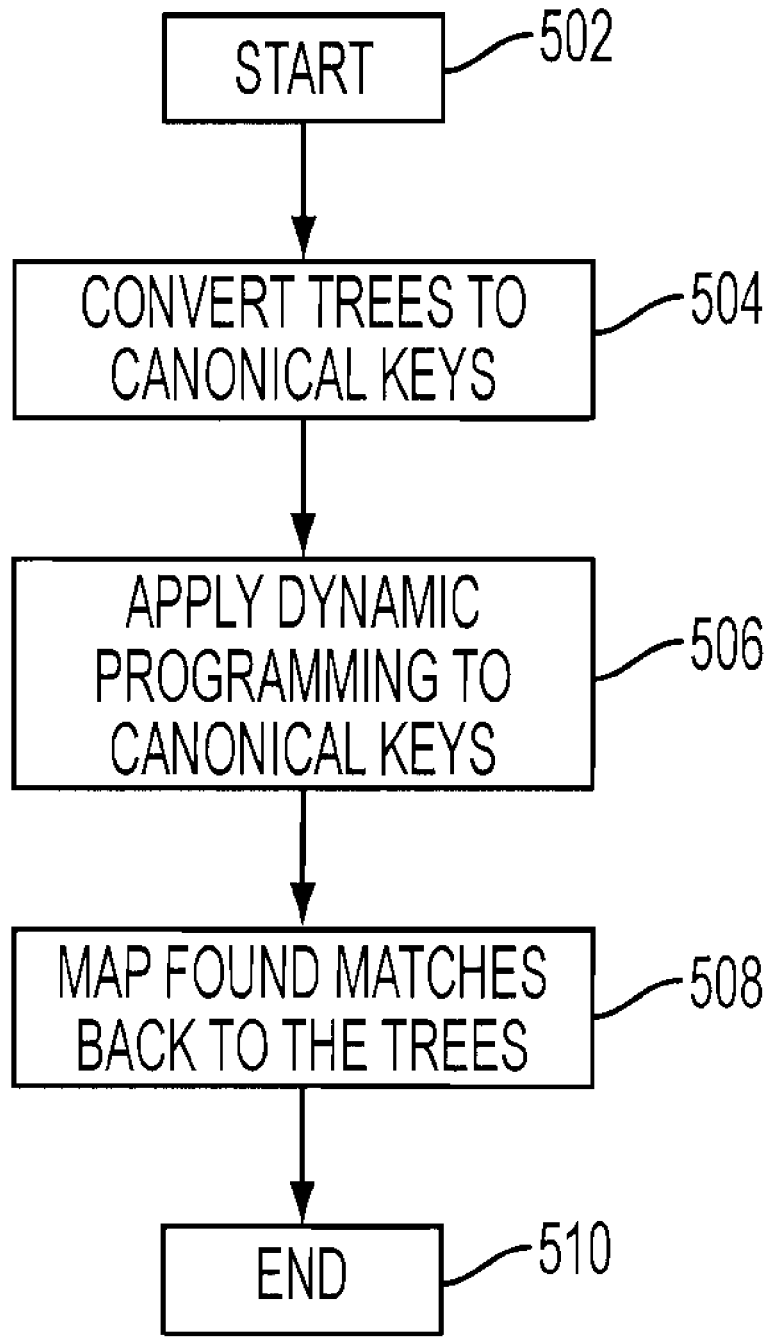
FIG. 5 is a flow chart illustrating a process for subtree matching according to an embodiment.

FIG. 5 is a flow chart illustrating a process for subtree matching according to an embodiment. At the start of the process (502), at least two trees are received by a subtree matching engine. The two input trees may actually be a part of the same larger tree.

Each of the trees is then converted into a representation in the form of a key (504). A key is a lossless representation in that it preserves all the information about the nodes and relationships between the nodes in the tree, but it also topologically standardizes the nodes to make it possible to locate matches using the two keys created from the two input trees. In general, a key is a canonical representation of a tree. This canonical representation may be convenient for further processing and locating matches between subtrees. In an embodiment, a key is a string of characters or subkeys, some of them representing nodes in a tree, and the order of characters or subkeys in a key representing arrangement of nodes in a tree. Converting a tree-based representation to a key-based representation is described in further detail in connection with FIG. 6.

Once the trees have been converted into their respective key-based representations, a matching process is performed on the keys (FIG. 5, 506). The matching process attempts to locate maximal matches in the keys. A match between portions of two keys need not be a strict lexicographical match— that is, performing typical substring matching on the keys may result in omitting to locate all possible matches of interest. In an embodiment, dynamic programming and a novel way of representing portions of keys may be employed in order to locate possible matches in the key-based representation. The subkey matching process is described in further detail in connection with FIG. 7.

Any subkey matches that are found may need to be mapped back to the tree-based representations (FIG. 5, 508). Mapping the subkeys back to the tree-based representation may involve a mapping process that is the reverse of the one described in connection with FIG. 5, or it may be arranged in any number of different ways, such as, for example, by keeping an index of correspondences between each character in a key and a node it represents. Once the mapping from subkeys have to the trees have been accomplished, all possible subtree matches have been identified, and the subtree matching process completes (510).

Converting a Tree-Based Representation into a Key-Based Representation

In trees where all nodes are ordered, a key-based representation may be obtained by an ordered traversal of the nodes starting at the root. However, for trees with unordered nodes, an order may need to be imposed on the unordered nodes in order to arrive at a canonical key-based representation. The presence of unordered nodes may introduce additional complexity because not only are the children nodes of an unordered node interchangeable, but the entire maximal subtrees beneath the children are also interchangeable.

Representing trees using a canonical key-based representation may in effect bring order to unordered nodes. One approach to canonicalization is to order the children according to some order of their types. This may not be sufficient, however, in some embodiments, because ambiguity may creep in when two children of an unordered node have the same type. Taking this concept a step further, it may be possible to use a key-based representation of a given tree to generate a canonical key of that tree. A key may be a collection of characters or subkeys arranged in such a way as to represent a tree. A key is a canonical key if it is the same for any functionally equivalent tree, despite different possible order at unordered nodes. For example, a prefix string may be used as a canonical key representation.

In an embodiment, the prefix string for a subtree under a given node, $v$, may be, essentially, the node's type($v$), followed by parenthesized, comma-separated list of its children. Each child, in turn, is either another prefix string or the terminal '$', if the child is a (pseudo) leaf node of the tree. In embodiments where type of a node may be represented as string of several characters, as a structure, an object, etc., it may be possible to convert those types to a simplified representation in order to use that simplified representation in a key-based representation. It should be understood as well that embodiments are not limited to the punctuation and characters described herein; alternative embodiments may use different semantic separators or a different structure for a key-based representation.

Constructing a prefix string for a given tree amounts to performing a pre-order traversal of the tree. At each node, $v$, its type, type($v$) may be appended to the key string. When the first child is accessed from a given node, a '(' is appended to the string; when accessing the next sibling, a ',' is appended and finally after accessing the last child of a node, a ')' is appended to the string. Thus, there is a one-to-one mapping between a tree and its prefix string, given by Prefix(T).

In case of unordered nodes, canonical faun may be achieved by enforcing a lexicographical or other ordering on unordered nodes. Specifically, the order of children of an unordered node may be the same as the lexicographic order of the children's maximal subtrees' prefix strings. Canonicalization may be used to prune the search space for subtree matches without sacrificing optimality. In other words, it may not be necessary to flip the children of unordered trees in looking for a match because the canonical representation of two functionally equivalent subtrees is guaranteed to be identical.

Figure 6:
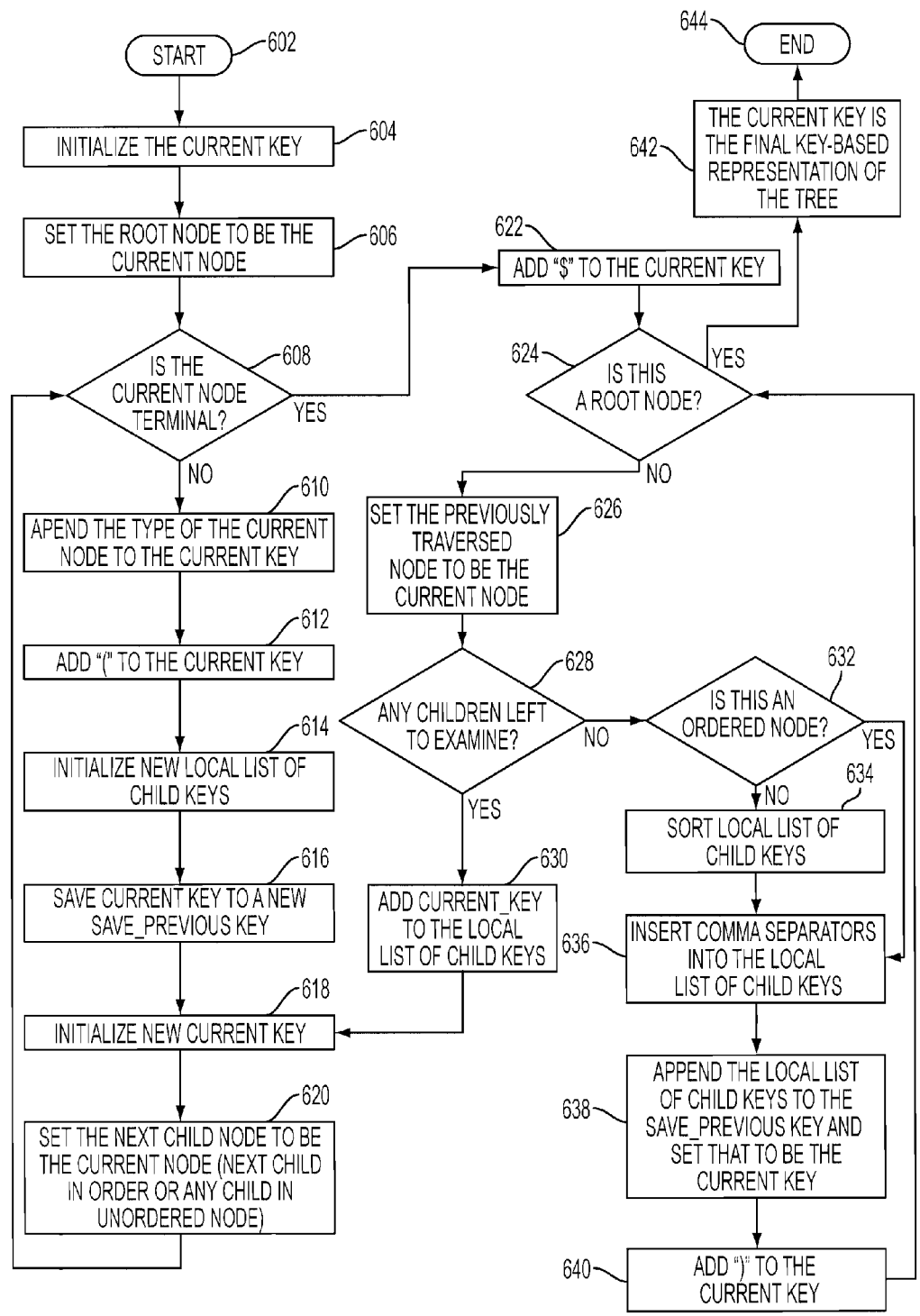
FIG. 6 is a flow chart illustrating the process of transforming a tree-based representation of resource use patterns to a key-based representation according to an embodiment.

FIG. 6 is a flow chart illustrating the process of transforming a tree-based representation to a key-based representation. After the beginning of the transformation process (602), a new key is initialized and is stored in a variable representing a current key (604). The root node is assigned to a variable representing the current node being examined (606). The process proceeds in a loop, at each iteration checking whether the current node is a terminal node (608). Even the root node may be a terminal node in some cases, if the tree has only one node.

If the current node is not a terminal node (608), its type is appended to the current key (610) and an open parenthesis is added to the current key before examination proceeds to the current key's nodes (612). In order for the transformation process to proceed to examine child nodes of the current node, it may be useful to initialize a list of subkeys for the child nodes (614) and save the current key to a separate variable (616). After the current key has been saved, the variable 'current key' is initialized again to be used in storing subkeys for a child node (618). This saving and initialization may be needed for unordered nodes, because keys for children nodes may need to be reordered after traversal of those nodes and ensuing subtrees is complete. In case of a tree with only ordered nodes, it may be possible to dispense with saving and creating new subkeys and to append all subkeys to one main key. The transformation process of FIG. 6, however, works on trees with both ordered and unordered nodes.

Once the variable 'current key' has been initialized again (618), one of the children nodes is assigned to be the current node (608) and the transformation process proceeds to examine the new current node for whether it is a terminal node (608).

If the current node is a terminal node (608)—that is, if the transformation process has reached one of the leaves of the tree, a "$" is appended to the current key (622). Once a leaf is reached, the tree traversal starts backtracking, returning to parent nodes. In backtracking, it may check for whether it backtracked all the way back to the root node (624). If the root node has not been reached yet, the previously traversed node—the parent of the current leaf node—is set to be the current node (626). For this new current node, a check is made to see whether there are any children of the current node that have not been examined yet (628). If there are children nodes left to examine, the current key is added to a local list storing child keys (630), and the transformation proceeds to initialize a new current key (618) for the next child node to be examined (620). In such a way, the transformation process loops through all nodes in a tree, in a process similar to a depth-first search. In an alternative embodiment, the transformation process may be similar to a breadth-first search or to other tree traversal patterns.

When all the children nodes of the current node have been examined (628), a check is made for whether the current node is an ordered node (632). The process then diverges slightly for ordered and unordered nodes. For unordered nodes, subkeys found for each of the children nodes and stored in a local list of child keys may need to be ordered (634). The ordering may be a lexicographic ordering or any other ordering, as deemed appropriate by one of skill in the art. Almost any ordering scheme may do, so long as it results in a consistent ordering on the same input subkeys. For ordered nodes, the order may be imposed already, and no additional sorting may be needed.

In order for the subkeys for children nodes to be added to a global key, separators may need to be inserted between them (636). In an embodiment, a comma may act as a separator. In alternative embodiments, almost any other character and/or a set of characters may be employed as separators, so long as they do not occur in whatever alphabet that is used to represent node types in canonical keys. When the separators have been inserted (636), the local list of child keys is appended to a key that has previously been saved for this node (638). The saved key with newly appended subkeys is then set to be the current key (638). A closed parenthesis is added to the current key to identify the end of subkeys for the children nodes (640). Similar to the comma separators, both open and close parenthesis may be replaced with other indicators in other embodiments.

At the close of examining and recording keys for the children nodes, a check is made to determine whether the current node is a root node (624)—that is, whether the whole tree has already been traversed. If the whole tree has not been traversed, the traversal backtracks further (626), however, if the root node has once again been reached, the current key then holds the overall key-based representation of the tree (642) and the transformation process is complete (644).

Figure 7:
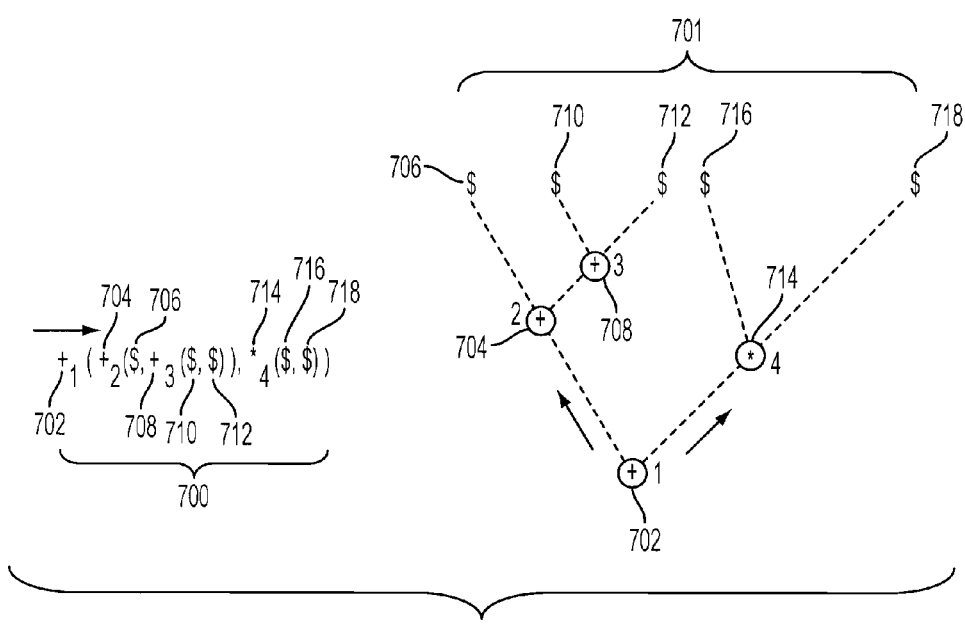
FIG. 7 is an illustration of an exemplary tree and its corresponding canonical key-based representation.

FIG. 7 is an illustration of an exemplary tree and its corresponding canonical key-based representation. Shown is a tree 701 and its corresponding prefix string 700 determined according to the process described in connection with FIG. 6. Arrows represent the direction of traversal, and similar numbers are used to represent similar components. All nodes 702, 704, 706, 708, 710, 712, 714, 716, and 718 of tree 701, including resource nodes 702, 704, 714, and 708 are unordered. In the corresponding prefix string 700, subkeys corresponding to those nodes have been labeled with subscripts indicating which of the node this particular subkey is coming from. These subscripts typically would not be present in a key-based representation stored in computer memory. Indeed, they may be unnecessary, because the key-matching process that follows after the transformation process, may attempt to match subkeys regardless of which portion of the tree they initially come from, so long that they match.

Maximal Common Prefix Substring Matching

Figure 8:
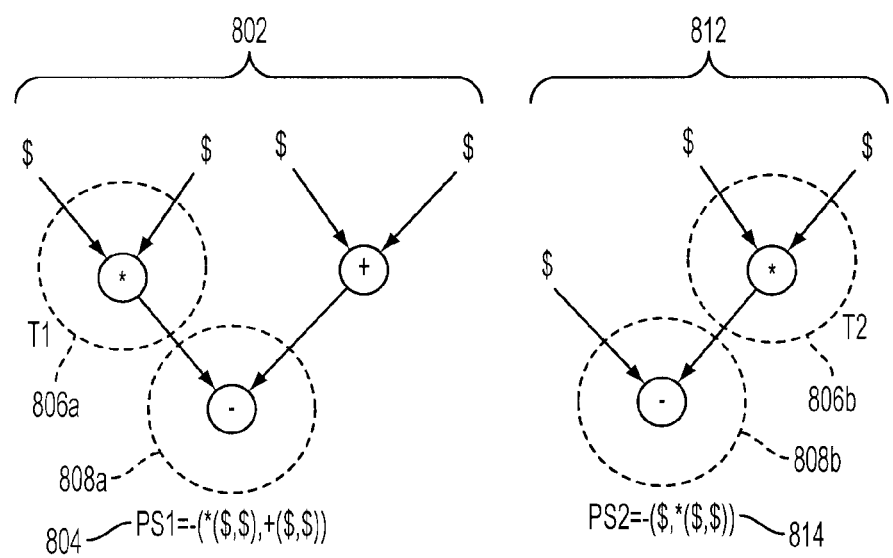
FIG. 8 illustrates exemplary two trees for which simple string matching on their key-based representation will fail to find maximal isomorphs

A maximal common prefix substring matching (CPSM) process is a process of finding appropriate matches within key-based representations. Although the process involves matching substrings of a key, a simple string matching mechanism may fail to locate all maximal isomorphs of the reference trees. Illustrated in FIG. 8 are two trees for which simple string matching on their key-based representation will fail to find maximal isomorphs. Trees 802 and 812 have two maximal isomorphs, rooted at '*' 806a/b and at '-' 808a/b. However, a naïve string matching algorithm on prefix strings PS1 804 and PS2 814 can only yield matching at '*' by matching "*($, $)." In many cases simple substring matching will only yield isomorphs that are also maximal subtrees, that is, those sharing their leaves with the reference trees. Internal (non-maximal) subtrees like '-' 808a/b in FIG. 8 may not be matched by substring matching. Therefore, in an embodiment, a more context-aware key scanning mechanism is used in order to find all maximal isomorphs.

Traversing an expression tree in the prefix order amounts to performing a linear scan of its prefix string. During the process of scanning a prefix string, skipping an entire resource use subtree pattern—such as an operation string pattern—starting at an operation effectively means stopping the traversal of the expression tree at the corresponding operation node. If the traversal is stopped at an operation before reaching a terminal '$', that point may be represented in a key as an 'OP.'

Figure 9A:
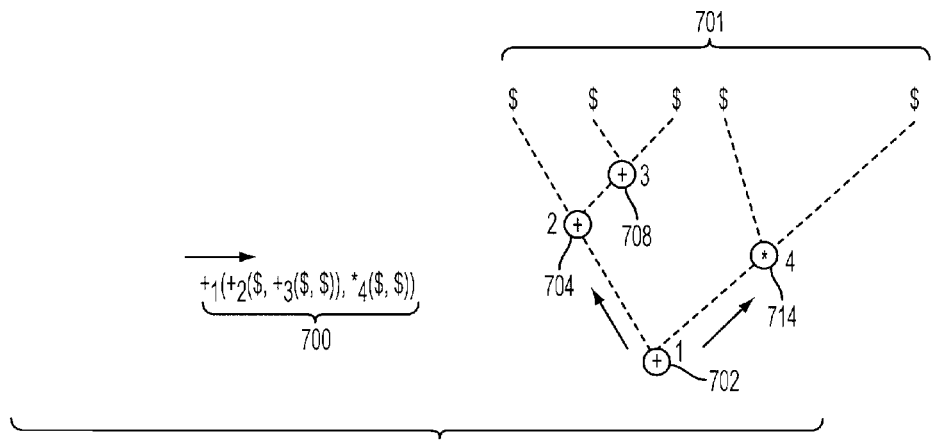
FIGS. 9A-B illustrate a tree from FIG. 7 and a corresponding tree with one of its subtrees replaced by an OP.
Figure 9B:
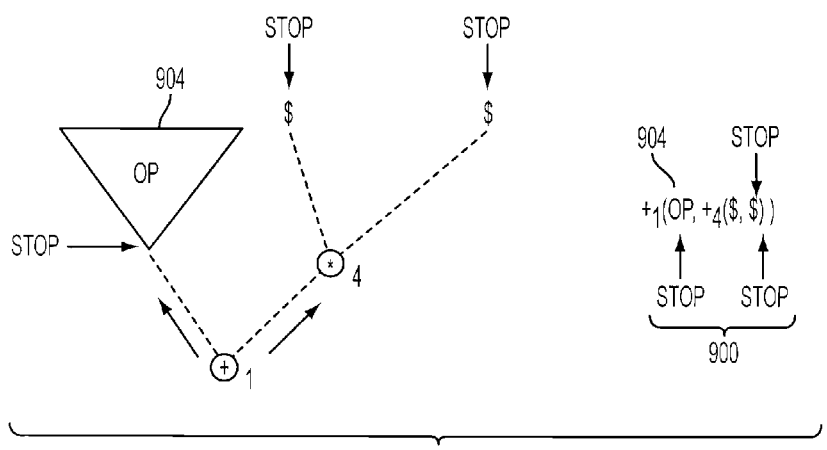

FIGS. 9A-B illustrate a tree from FIG. 7 and a corresponding tree with one of its subtrees replaced by an OP. The arrows in FIG. 9A show the directions of traversal and scan. After visiting node 702, pruning the subtree rooted at node 704 is tantamount to skipping the whole key pattern "+2($,+3($,$))." The newly formed pattern, as shown in FIG. 9B is thus represented as key 900 "+1(OP, 4($,$))," clearly indicating the places the traversal stopped by '$' or OP (904) depending on whether the stopping point is a terminal node or intermediate node respectively.

In embodiment, properties of prefix strings may be taken advantage of in order to use a dynamic programming process for locating matches among keys. The properties of prefix strings may be described as follows:

Let $PS_1[1 \ldots m]$ and $PS_2[1 \ldots n]$ be the two prefix strings of length m and n respectively. Let k be the length of the longest common prefix substring and LCPS(k) be the set of all longest common prefix substring matches, each of length k, ending at positions $1 \leq p_1, p_2, \ldots, p_t \leq m$ in $PS_1$ and $1 \leq q_1, q_2, \ldots, q_t \leq n$ in $PS_2$, where $t=|LCPS(k)|$. Let $L_k$ refer to a member of LCPS(k). Then the following holds true:

1. If $PS_1[p-1]=$ '\$' and $PS_2[q-1]=$OP, $(2 \leq j \leq q)$, then $L_{k-1}$ is a longest common prefix string for $PS_1[1 \ldots p-2]$ and $PS_2[1 \ldots q-j]$ ending at the alphabet positions p-2 and q-j of $PS_1$ and $PS_2$ respectively.
2. If $PS_1[p-i+1 \ldots p-1]=$OP and $PS_2[q-1]=$ '\$', $(2 \leq i \leq p)$, then $L_{k-1}$ is a longest common prefix string for $PS_1[1 \ldots p-i]$ and $PS_2[1 \ldots q-2]$ ending at the alphabet positions p-i and q-2 of $PS_1$ and $PS_2$ respectively.
3. If $PS_1[p-i+1 \ldots p-1]=$OP and $PS_2[q-i+1 \ldots q-1]=$OP, $(2 \leq i \leq p, 2 \leq j \leq q)$, then $L_{k-1}$ is a longest common prefix string for $PS_1[1 \ldots p-i]$ and $PS_2[1 \ldots q-j]$ ending at the alphabet positions p-i and q-j of $PS_1$ and $PS_2$ respectively.
4. Otherwise, $L_{k-1}$ is a longest common prefix string for $PS_1[1 \ldots p-1]$ and $PS_2[1 \ldots q-1]$, ending at the alphabet positions p-1 and q-1 of $PS_1$ and $PS_2$ respectively.

Figure 10:
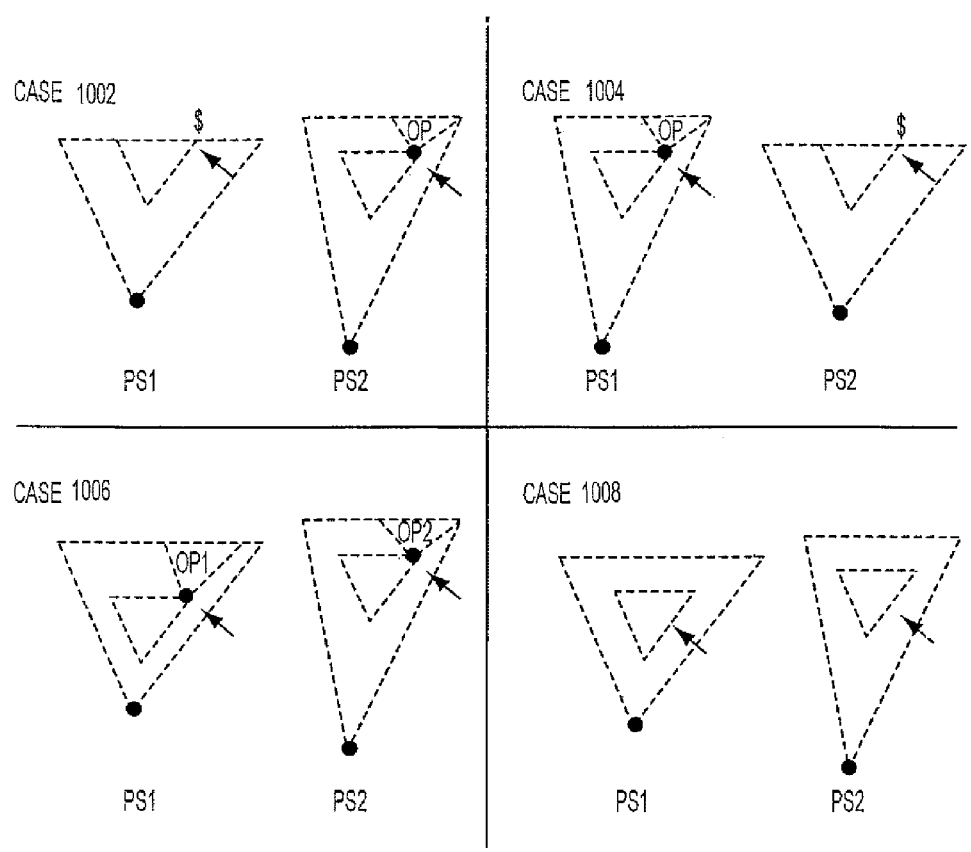
FIG. 10 is a schematic representation of four cases of subtree matches.

That is, there are four cases that may involve skipping over an entire operation substring or a terminal or matching internal subtrees. These four cases of subtree matches are shown schematically in FIG. 10. The arrows pinpoint to the cases clearly using two sample reference trees and prefix strings (PS1 and PS2). The cases 1002, 1004 and 1006 involve skipping over an entire operation substring or a terminal, while case 1008 is an exact match of a non-leaf alphabet and therefore does not involve any skipping transforms.

The problem of canonical prefix substring matching (CPSM) may have an optimal substructure, i.e., an optimal solution to this problem contains within it optimal solutions to its subproblems. A dynamic programming approach may be employed to take advantage of this optimal substructure. The dynamic programming approach is a processing technique that solves the overall problem by solving subproblems and memorizing the results of those subproblem solutions. Memorization is an optimization technique that may involve storing computed values during the processing so as not to recomputed them again if they are needed for further processing. Thus, using dynamic programming for CPSM may involve storing indications of smaller substring matches in order to find maximal substring matches. In an alternative embodiment, dynamic programming need not be employed, and the process may scan the prefix substrings over and over in order to find possible matches, while still considering possible replacements of subkeys with OPs. In an embodiment, for $1 \leq p \leq m$ and $1 \leq q \leq n$, LCPSL(p,q) is the length of a longest common prefix substring for $PS_1[1 \ldots p]$ and $PS_2[1 \ldots q]$.

Cases 1002, 1004 and 1006 may be expressed by three conditions. These conditions are illustrated in FIG. 11A. If $PS_1[p]=PS_2[q]$, where $1 \leq p \leq m$, $1 \leq q \leq n$, for $2 \leq i \leq p$ and $2 \leq j \leq q$, the longest common prefix substring length (LCPSL) for each position in a matching process may be described by four alternatives, depending on conditions in cases 1002, 1004 and 1006. A "position" as used herein refers to LCPSL(p,q) for indexes p and q into two keys on which the matching process operates. The LCPSL computation (1102) based on the three conditions is illustrated in FIG. 11B.

Based on the computation directions shown in FIG. 11B, it may be possible to write an exponential time recursive algorithm to compute the matching prefix substrings. However, because there are only $O(m \cdot n)$ distinct subproblems, in an embodiment it may be possible to use dynamic programming to obtain the solutions bottom up.

A dynamic programming implementation may employ an m×n LCPSL matrix to store the intermediate lengths of the matching substrings. In addition, it may encode the substring enumeration solution with the help of P_PREV(p,q) (1104) and Q_PREV(p,q) (1106), which are respectively defined as the last positions in the prefix strings $PS_1$ and $PS_2$ that were matched by the algorithm, prior to matching the current positions p and q in the two strings (i.e., $PS_1[p]=PS_2[q]$, where $1 \leq p \leq m$, $1 \leq q \leq n$). This encoding alleviates the exponential space overhead that would be otherwise required to enumerate all solutions. Computation of P_PREV(p,q) and Q_PREV(p,q) based on the three conditions of FIG. 11A is illustrated in FIG. 11C.

Using LCPSL, P_PREV, and Q_PREV, it may be possible to generate all the common prefix strings enumerating $PS_1$ (using P_PREV) and $PS_2$ (using Q_PREV). This in turn corresponds to all the maximal isomorphs in the original expression tree.

In order to walk the generated substring positions in LCPSL in the forward direction, P_NEXT and Q_NEXT may be defined as follows: P_NEXT(P_PREV(p), Q_PREV(q))=p and Q_NEXT(P_PREV(p), Q_PREV(q))=q, where $0 \leq p \leq m$, $0 \leq q \leq n$. To enumerate all the matching prefix strings, the process may start with positions having LCPSL set to 1 and then walk the PS_1 or PS_2 strings using P_NEXT and Q_NEXT, respectively. These matched prefix strings in turn enumerate all the maximal isomorphs in the reference trees.

In an embodiment, in order to enumerate the longest common prefix string or the maximal isomorphs (instead of capturing all the internal ones as well), the matching process may check before setting LCPSL(p,q) whether the newly computed value is greater than the stored value of LCPSL(p,q). This is because any one of the above cases presented in FIG. 10 may be the reason for finding a match at location (p,q).

Common Prefix Substring Matching Using Dynamic Programming

FIGS. 12A and 12B are illustrations of pseudocode for dynamic programming process for common prefix substring matching of an embodiment. The dynamic programming process takes the prefix strings $PS_1$ and $PS_2$ as inputs (1202), and populates the solution in terms of matrices LCPSL, ΔP_NEXT and ΔQ_NEXT. LCPSL matrix tracks the lengths of substrings at various positions in $PS_1$ and $PS_2$. P_NEXT (p,q)=p+ΔP_NEXT(p,q) points to the next matching position for $PS_1$, and Q_NEXT(p,q)=q+ΔQ_NEXT(p,q) points to the next matching position for $PS_2$.

The process begins by building operation position tables for strings PS_1 and PS_2, which mark the beginning and ending of each valid operation in the prefix strings. (1206). The operation position tables represent possible replacements of subkeys with OPs. The operation position tables may be built before the CPSM process, or they may be built during the initial transformation process, when tree based representations are transformed into key-based representations.

The dynamic computation of the solution matrices based on the above formulation is shown between lines 21 and 57. (1214). Note that in order to favor the growth of the largest valid substring, the pseudocode shown in FIGS. 12A and 12B explicitly checks whether a new substring length is greater than any existing substring length evaluated so far, at a particular matching point (p,q). This is done in lines 36, 44, and 52. (1218a-c). The dynamic updates of LCPSL, ΔP_NEXT, and ΔQ_NEXT can be tracked in lines 28-30, 37-39, 45-47, and 53-55. (1216a-d).

Figure 13A:
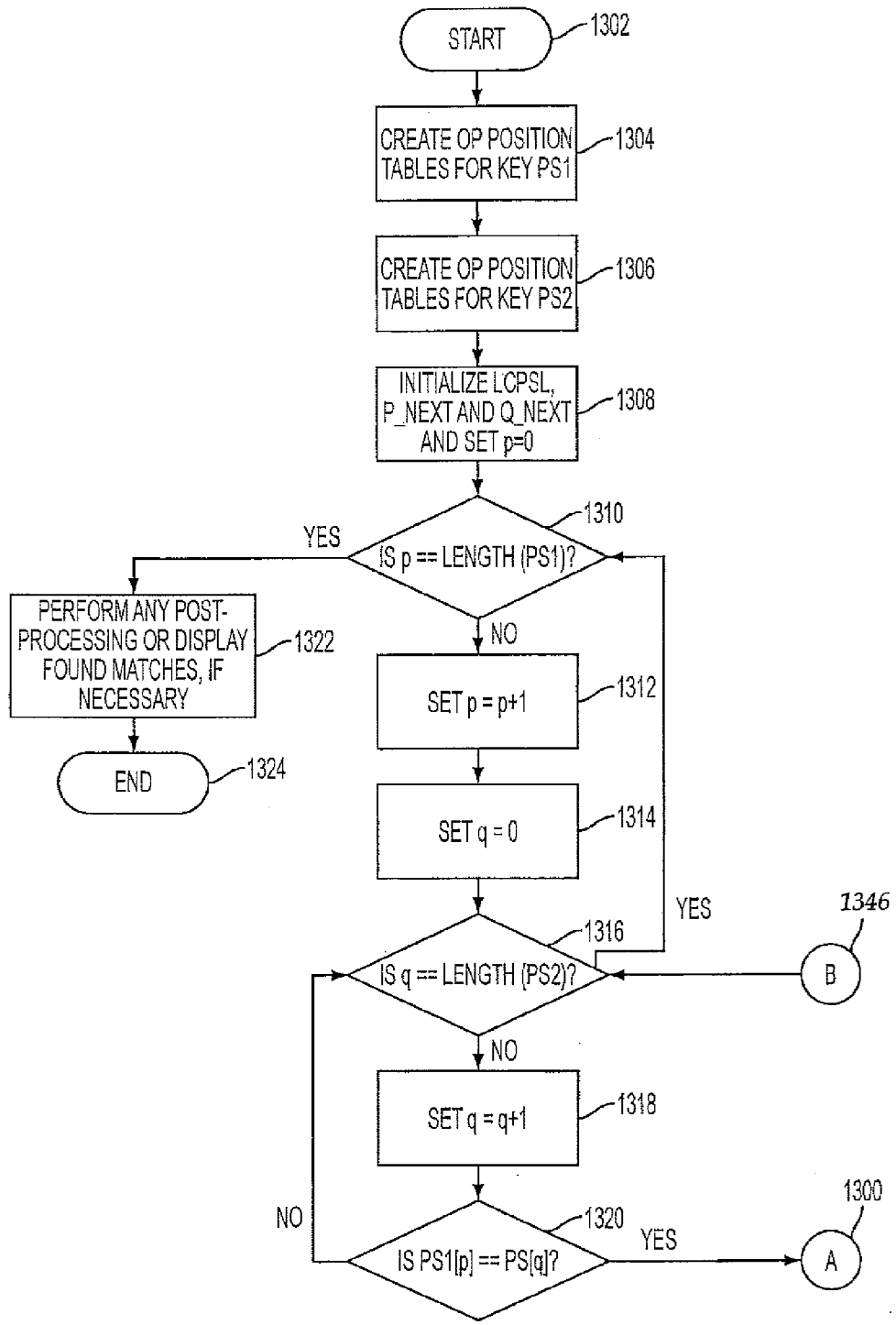
FIGS. 13A-B are a flowchart of the process of FIGS. 12A and 12B.
Figure 13B:
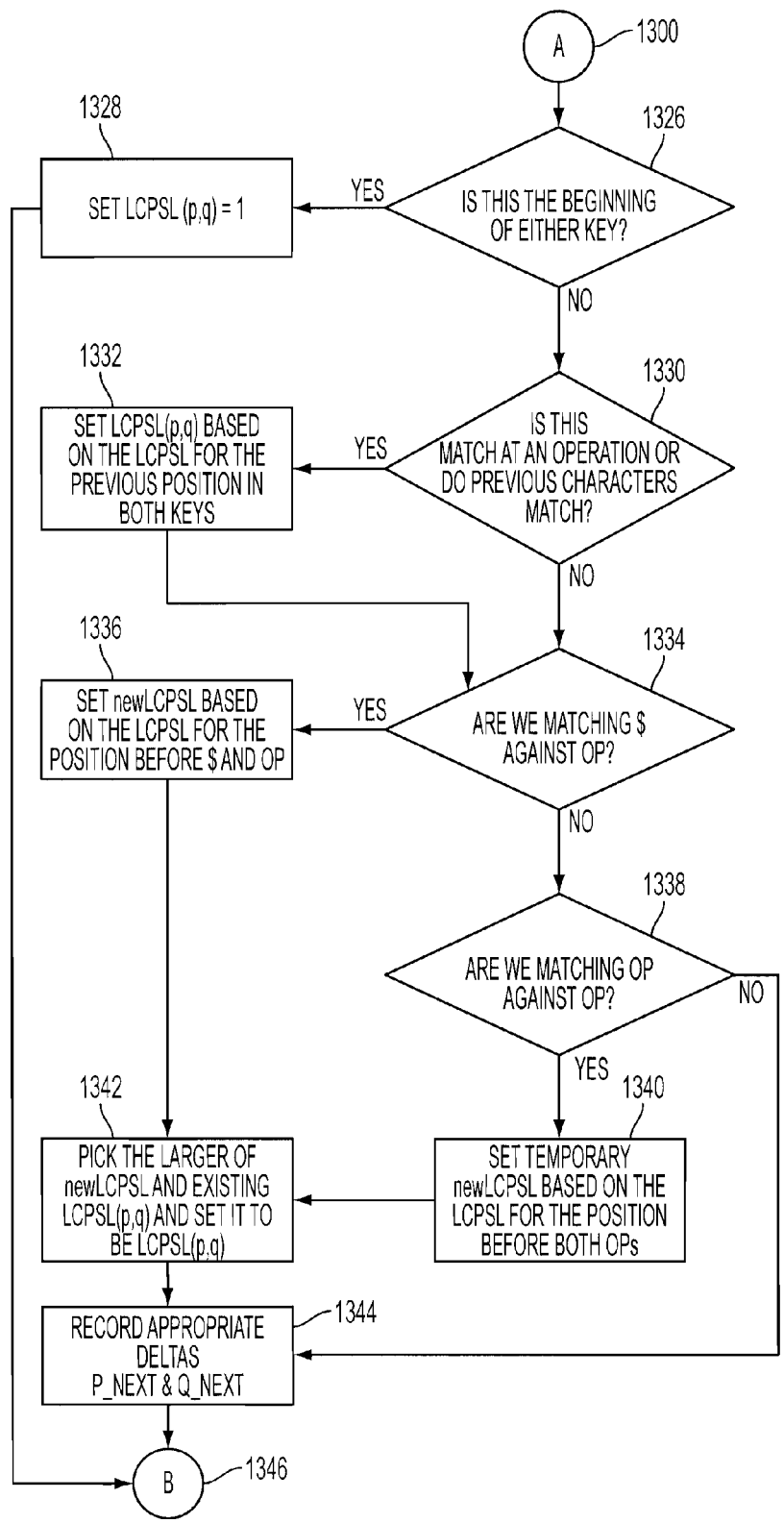

FIGS. 13A-B are a more general flowchart of the process of FIGS. 12A-12B. At the start of the CPSM process (1302), OP position tables for keys PS$_1$ and PS$_2$ are created (1304 and 1306). LCPSL, P_NEXT and Q_NEXT matrices are then initialized, and an index into key PS$_1$ is set to 0. (1308).

Matching between two keys proceeds by matching each character of one key against each character of the other key. An outer loop, starting at 1310 walks through characters of one key, while an inner loop, starting at 1316 walks through characters of the other key. Within the outer loop, counter p is updated (1312) and counter q, which is an index into the second key, is reset (1314), so that for each character of the first key, the iterations of the second loop may begin anew.

Within the inner loop, counter indexing into the second key is updated (1318), and a check is performed whether the two characters of two keys at the current positions match each other. (1320). If there is no match, the looping continues (1316), until a match is found or the end of both keys is reached (1310). If a match is found (1320), additional processing (1300) may be needed to determine the longest possible prefix substring leading up to this character match and to update the dynamic programming matrices. This processing is illustrated in FIG. 13B.

If the match is found at the beginning of either key (1326), then the LCPSL is set to 1 (1328), because there can be no previously-found match of which the current match is a continuation, and the process proceeds to looping through the inner loop (1346). If there is an OP at the position of the match, or there is a match right at the previous position in both keys (1330), LCPSL (p,q) is set based on the LCPSL for the previous match position by adding 1 to the LCPSL for the previous match position. (1332).

Then the checking for various conditions begins. If one of the strings has a '$' at a previous position, and another has an OP, that may constitute a subkey match (1334), in which case temporary LCPSL is set based on that previous match. (FIG. 12B, 1216b and 1216c; FIG. 13B, 1336). If the previous character is part of an OP in both keys (1338), that may be a match as well, and temporary LCPSL may be set based on the LCPSL for the position before both OPs (FIG. 12, 1216d; FIG. 13B 1340).

After determining temporary LCPSL, the process picks the larger of the existing LCPSL for this position and the temporary LCPSL (1342) in order not to overwrite a longer match with a shorter match. In an alternative embodiment, all possible matches may be kept and recorded, without checking for which is a longer one. In yet another embodiment, several different matches may be kept for the same position. If the current match is longer than the previously found one, delta matrices—a table of deltas representing "steps" in a key from one matching portion to another—may need to be updated accordingly (1344) to reflect the jumps in matching from the previous positions to the current position. After the deltas are recorded, the processing goes on to the next character in the second key, if any. (1346).

When both keys have been traversed completely, some post-processing actions may take place. (FIG. 13A, 1322). Such post-processing actions may include storing and/or displaying any of the matrices populated during the processing or other actions. In addition, storing and displaying of various matrices values and/or found matches among the keys may be performed concurrently with the CPSM processing. Once the post-processing actions have been completed, the CPSM process ends. (1324).

The workings of the CPSM processing may be followed in connection with exemplary trees in FIG. 8 and their corresponding prefix string representations:

$$PS1 = -(*(\$,\$),+(\$,\$))$$

$$PS2 = -(\$,*(\$,\$))$$

The solution matrices LCPSL (1402), P_NEXT and Q_NEXT (1404), built according the CPSM processing of FIGS. 12A-12B and 13A-13B are shown in FIGS. 14A-B. There are two maximal substring matches encoded within the solution matrices. To enumerate each matching substring, the starting position may be found by the entry 1 in LCPSL matrix 1402 and with the assistance of (P_NEXT,Q_NEXT), the full matching substring may be found. The first match is (–(OP,OP) in PS1, –($,OP) in PS2), which starts at (0,0) as indicated by LCPSL 1402 and then walking down string positions is guided by the (P_NEXT,Q_NEXT) 1404 entries (1,1), (8,3), and (15,10). When the jump of P_NEXT or Q_NEXT is greater than 2, it indicates stopping at an operation subtree, which is represented by an OP. The second match is (*($,$) in PS1, *($,$) in PS2), corresponding to the entries (2,4), (3,5), (4,6), (5,7), (6,8), and (7,9). The second match is a straight-forward match as there is no jump in P_NEXT or Q_NEXT greater than 2.

Making Resource Sharing Determinations Based on Subtree Isomorphism

Matches found during the CPSM processing may be mapped back to the reference trees, from where, in turn, there may be mappings to resources. Based on the found matching subtrees, there may be determinations made whether to share any resources, and, if so, which ones should be shared and how. Those determinations may depend on various factors associated with system design, such as desired system parameters, preferences of the system designer, design space exploration results, optimization considerations, etc.

Figure 15:
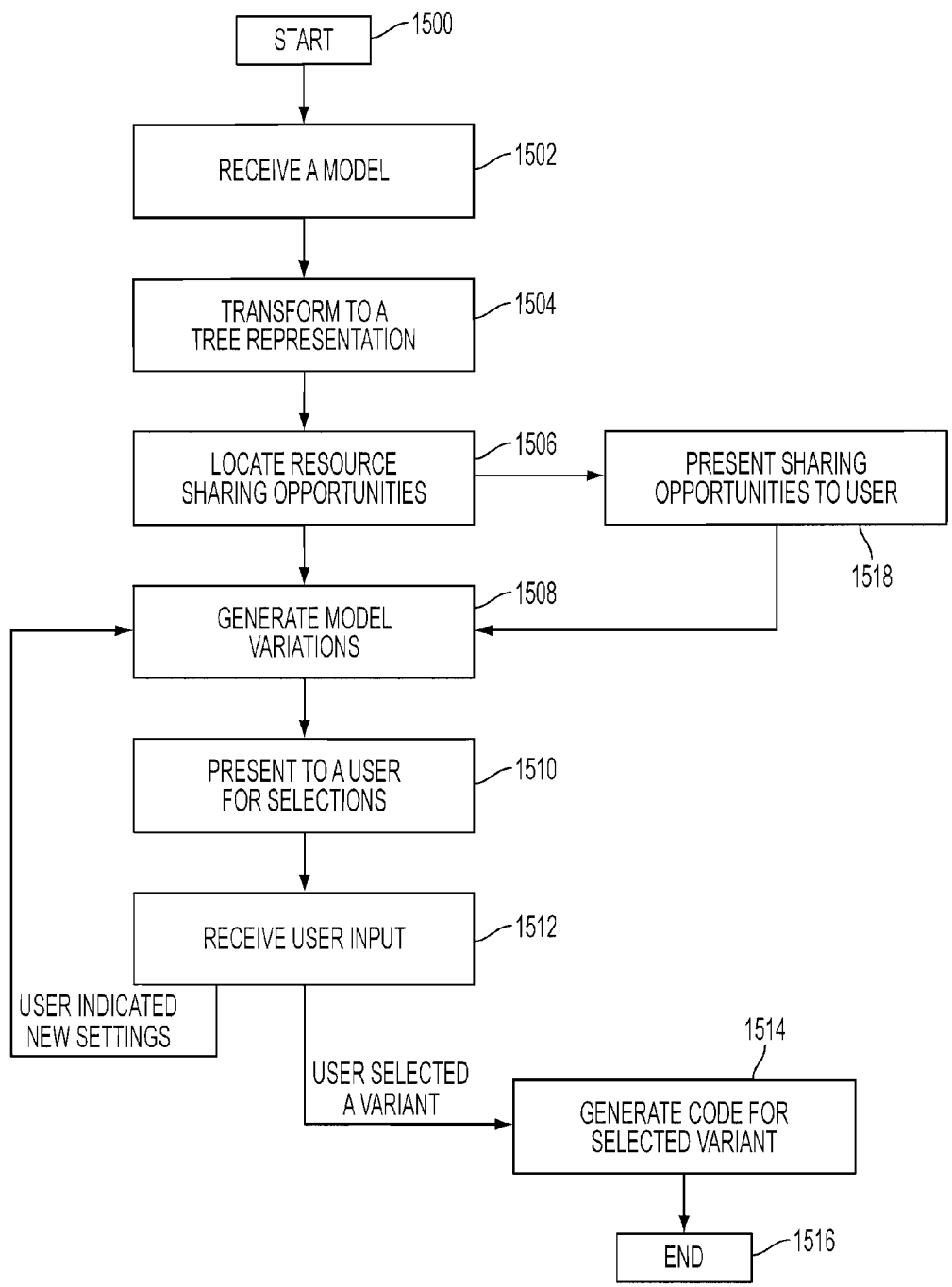
FIG. 15 is a flow chart of a system design process according to an embodiment.

FIG. 15 presents a flow chart of how locating resource sharing opportunities may fit into an overall system design process. At the start of the process (1500), there typically is a model (1502) representing a real world system. The model is then transformed to a tree-based representation (1504), such as, for example, a tree version of a control flow graph. The tree-based representation is analyzed to locate resource sharing opportunities (1506) as described above.

Once possibilities for resource sharing have been identified (1506), there are multiple ways to proceed. In some cases the possibilities are simply mapped back to the model and are presented to the user (1518). The presentation may include, for example, visually overlaying an indication of shareable resources on a view of a model. Alternatively, the presentation may include a textual and/or graphical specification of different sections of the model that may be shared. A user may then select one or more resources or groups of resources that may be shared. In order to accommodate for resource sharing, a model may need to be modified and/or one or more variations of the model may be created to indicate, test and implement a resource-sharing version. Such model variations may be automatically generated (1508) based on user's selection of what resources should be shared.

Model variations may also be generated without specific user input as to which resource to share (1508). A modeling environment may use user preferences and/or information about system constraints to generate possible model variations including resource sharing opportunities. For example, in a case of a model of a hardware system, the modeling environment may generate variations of the model that do not violate known requirements for hardware system area, speed, throughput and/or cost.

In some cases there may be many possible resource sharing model variations. The modeling environment may enable the user to input preferences regarding a design exploration space—that is, how many possibilities and of what type to explore in attempting to generate viable model variations. The preferences may include preferences regarding a maximum number of variations or time it takes to generate the variations, and/or the kind of resources may be shared or the kind of resource sharing opportunities should be considered.

The model variations may be presented to the user for inspection (1510). The user may select one or more variations (1512) and/or indicate additional preferences or settings for generating model variations (1508). Depending on the user selection, code may be generated and/or synthesized for selected variations (1514), and/or the model may be augmented based on the selected variation. In such a way, the design, testing and implementation process may proceed until the user is satisfied with the generated model and/or its implementations (1516).

Returning now back to the example of HDL generation and/or hardware synthesis, there may be improvements to be had from resource sharing, as well as some side effects. In terms of timing, the primary overhead due to resource sharing may be in the routing delay. From this point of view, resource sharing may be justified for large designs when the critical path delay is long. In these cases, the overhead due to routing may be more than offset by the length of the critical path. In terms of area, there can be substantial reductions due to resource sharing. The overhead introduced by the additional multiplexers and resource controllers may be small if a lot of resources are shared. It may also be preferable to perform resource sharing for large designs from the area standpoint.

There may be different approaches to evaluating usefulness, benefits and drawbacks of resource sharing in the case of each particular design.

Figure 16:
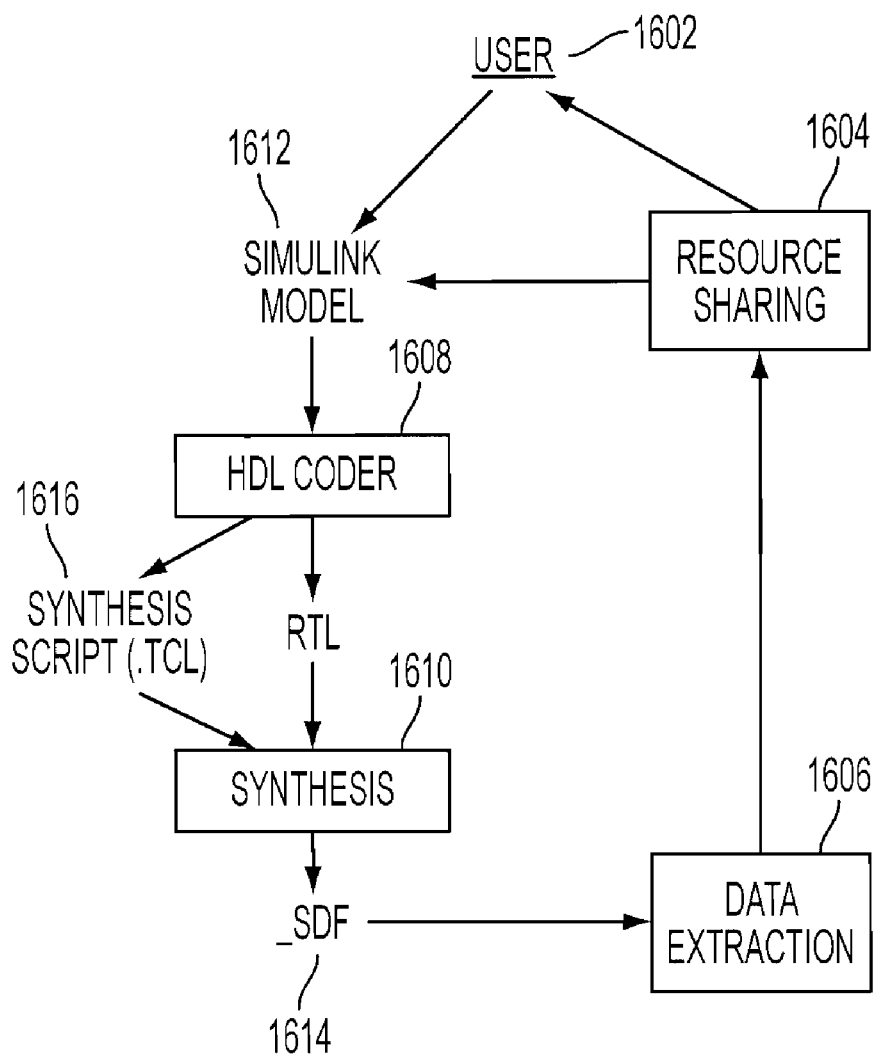
FIG. 16 is an example of a possible design exploration loop of an embodiment dealing with HDL generation and synthesis.

FIG. 16 is an example of a possible design exploration loop of an embodiment dealing with HDL generation and synthesis. Initially, user 1602 presents to the modeling environment model 1612, such as, for example, by opening a model file in the Simulink® modeling environment. Code is then generated from the model by an HDL coder (1608), and results of the synthesis of the HDL code (1610) are written to an .sdf file (1614). The .sdf file is a standardized ext file format called Standard Delay File (sdf) that is generated by a number of synthesis tool. The .sdf file format may be essentially a list of different components in the synthesized design and their timing characteristics. In an alternative embodiment, the results of the synthesis may be stored using a different data and/or file format. Being able to extract information from the synthesis file (1606) may involve using a specialized synthesis script (1616).

After data has been extracted from the synthesis file (1606), it may be provided to the resource sharing identification process (1604), which can then make quality design decisions and generate one or more new resource-shared models/graphs, which may once again be processed by the HDL Coder (1608). This flow may be iterated as many times as needed until the desired design goals have been accomplished.

Generating the resource-shared variations of the model may involve rearranging branches of the control flow graphs and adding or removing elements in order to accommodate alternative data and control flow paths. For example, as seen from FIGS. 2A-B and others, introducing resource sharing to the HDL code may involve introducing additional multiplexors and/or resource controllers. The multiplexors, resource controllers and modifications in control and flow paths may be added automatically by the modeling environment, based on graph and/or tree modification heuristics that preserve the functionality of the original model.

Figure 17:
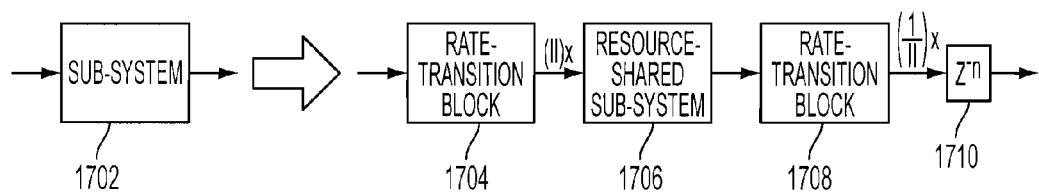
FIG. 17 is a diagram of fixing timing side-effects of a resource-shared subsystem.

As discussed above, introducing sequential resource sharing into a model of a hardware system may involve changing timing details of some parts of the model. FIG. 17 is a diagram of fixing timing side-effects of a resource-shared subsystem. Subsystem 1702 is analyzed for possible resource sharing opportunities and is transformed into resource shared sub-system 1706. Consequently, additional changes may be made to the overall model to account for possible timing changes within resource-shared subsystem 1706.

The overall model may be described by a dataflow graph, $G=(V,E)$ that is mapped to the model by an HDL coder. Each node, $v \in V$, represents a unit of computation that is mapped to a resource, given by $Res(v)$. Thus, if R is the set of all available resources, then, after resource sharing, there exists a one-to-one mapping, given by Res: $V \rightarrow R$, which describes the resources used to implement each type of operation.

Two different nodes, $v_i$, $vj \in V$ may map to the same resource, i.e., $Res(v_i)=Res(v_j)$, due to resource sharing. Thus, let $N(r)$ represent the number of nodes sharing a given resource, $r \in R$. To determine the inhibition of parallelism, resource sharing may need to be analyzed along the critical path. If the critical path of the system is given by the path, $CP=<v_1, \ldots, v_n>$, through G, then the initiation interval of the system is then given by the maximum sharing for any resource on this path:

$$\text{Initiation Interval, } II = \frac{\text{Max}}{vi \equiv CP} N(Res(v_i))$$

The initiation interval specifies the duration of time (in terms of clock cycles) during which no new input data-set can be injected in to the system's input ports. Thus, once a given set of inputs are streamed in to the system, the producer must wait for at least II cycles before streaming in the next set of inputs. Thus, II determines the data-rates at the inputs and outputs.

In such a way, it may be possible to describe the transformation of Gireu 17 that is equivalent to the semantics of resource sharing. This transformation is achieved using rate-transition blocks 1704 and 1708. At the input to the sub-system, the data-rate is increased by II times (or (II)×) at block 1704. This ensures that the next set of data inputs is not injected into sub-system 1706 until II cycles later. The rate is restored at the outputs of sub-system 1706 by another rate-transition block, 1708, which slows down the data-rate by (1/II)×.

Finally, integer delay block 1710 may be introduced for the initial delay through the sub-system, which is equivalent to the length of the critical path, $n=|CP|$. Transforming the model in this way may help maintain bit-true simulation equivalence between the original model and the modified variation.

As illustrated, delay blocks and rate transition blocks may be used to account for timing modifications in resource-shared model variations. Additional mechanisms for adjusting to model changes may be introduced by the modeling environment, as designed by one of skill in the art. Overall, the introduction of modifications may be automatic or may involve user input. Many different implementations are possible, and a particular one used may depend both on a device being modeled, the model, the modeling environment and/or specifics of the particular embodiment.

ADDITIONAL EMBODIMENTS

The application of isomorphic subtree matching is not limited to HDL coding and hardware synthesis. Instead, it may be applied across a broad range of real world systems.

In an embodiment, isomorphic subtree matching may be used in the domain of compilers and computer architectures. Trees may represent available Instruction Set Architecture (ISA) instructions that are matched against a compiler's intermediate representation (IR). Some IRs may be represented as directed acyclic graphs (DAGs) internally to begin with, but they may be converted into a tree representation in order to facilitate subtree matching.

Subtree isomorphism methods and systems may also be applied to common sub-expression elimination and code reuse optimizations. In these applications, trees may be used to represent a section of executable code, and isomorphic subtrees that are located through the process described above may be used to identify potential code loops, functions, libraries, etc.

In an embodiment, isomorphic subtree matching may be used in relation to hardware synthesis applications. In the hardware synthesis domain, technology mapping may pose a problem in which tree patterns from a given standard cell library are matched against a given abstract netlist of a hardware circuit. In such a case, patterns from the cell library and the netlist of the hardware circuit may be represented as trees, and their isomorphic subtrees may be used to identify library matches. In a related application, resource sharing may be used to attempt to maximize use of arithmetic and logic operators like adders or multipliers. Additionally, an embodiment may employ an approach where an entire subtree pattern, instead of a single operation, is chosen for sharing resources. Finding isomorphic subtrees may be useful for all these synthesis-related problems.

In the last few years, application-specific customizable processors of different flavors have been proposed as a viable solution for meeting rapidly changing demands of applications in hardware embedded systems. One of possible problems in such systems may be automatic generation of instruction set extensions (ISEs). In an embodiment, increasing the effectiveness and reusability of a particular ISE may involve identifying isomorphic subtree patterns of instructions in an intermediate representation, such that a frequently occurring subtree isomorph may become a custom instruction in the ISE.

The application of isomorphic subtree matching is not limited to identification of common resource usage patterns for computational resources. Resource usage patterns for any other kind of resources, including physical resources, scheduling resources, biological or chemical resources, etc., may all be represented using graphs and/or trees, and methodologies and systems described above may be used to identify common patterns among those trees in order to optimize the use of those resources based on the desired optimization parameters. In addition, identification of isomorphic subtrees can lead to enumeration of non-isomorphic nodes and patterns in trees. Such determination of non-isomorphic subtrees may also be useful for hardware generation and other applications, where it may be useful to determine that a particular resource or a group of resources are not shared among multiple resource use pathways.

The foregoing description has been directed to specific embodiments of the present invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A non-transitory computer readable medium comprising:
   one or more instructions, executed by at least one processor, to access a first tree-based representation of first resource usage patterns and a second tree-based representation of second resource usage patterns;
   one or more instructions, executed by the at least one processor, to transform the first tree-based representation into a first key-based representation, one or more nodes in the first tree-based representation including unordered children nodes, and the one or more instructions to transform the first tree-based representation into the first key-based representation including:
      one or more instructions to apply an ordering on the unordered children nodes of the one or more nodes in the first tree-based representation, the one or more instructions to apply the order, wherein the ordering comprising:
         one or more instructions to identify types of two or more children nodes, of the unordered children nodes,
         one or more instructions to apply, when the two or more children nodes are associated with different types, an ordering of the two or more children nodes based on the different types, and
         one or more instructions to apply, when the two or more children nodes are a same type, an ordering of the two or more children nodes based on ordering of respective children nodes;
   one or more instructions, executed by the at least one processor, to transform the second tree-based representation into a second key-based representation;
   one or more instructions, executed by the at least one processor, to determine one or more common subkeys within the first key-based representation and the second key-based representation;
   one or more instructions, executed by the at least one processor, to map at least one common subkey, of the one or more common subkeys within the first key-based representation and the second key-based representation, to at least one subtree of the first tree-based representation;
   one or more instructions, executed by the at least one processor, to identify resources corresponding to the at least one subtree of the first tree-based representation; and
   one or more instructions, executed by the at least one processor, to indicate the resources corresponding to the at least one subtree of the first tree-based representation as shared resources between the first resource usage patterns and the second resource usage patterns.

2. The non-transitory computer readable medium of claim 1, where the first tree-based representation comprises a first subtree of a third tree-based representation, and where the second tree-based representation comprises a second subtree of the third tree-based representation.

3. The non-transitory computer readable medium of claim 1, where the one or more instructions to transform the first tree-based representation into the first key-based representation further comprise:
one or more instructions to transform the first tree-based representation into a prefix string representation.

4. The non-transitory computer readable medium of claim 1, where the one or more instructions to determine the one or more common subkeys within the first key-based representation and the second key-based representation further comprise:
one or more instructions to use a dynamic programming process to determine the one or more common subkeys.

5. The non-transitory computer readable medium of claim 4, where the dynamic programming process is to skip over one or more subkeys when determining the one or more common subkeys.

6. The non-transitory computer readable medium of claim 1, where the resources are computing resources and one or more nodes of the first tree-based representation and of the second tree-based representation correspond to operations using the computing resources.

7. The non-transitory computer readable medium of claim 6, where the resources are hardware logic computing resources.

8. The non-transitory computer readable medium of claim 7, where the hardware logic computing resources comprise one or more or a combination of:
a gate,
a register, or
a field programmable gate array (FPGA) cell.

9. The non-transitory computer readable medium of claim 1, further comprising:
one or more instructions to determine a possible allocation of the shared resources between the first resource use patterns and the second resource use patterns.

10. The non-transitory computer readable medium of claim 9, further comprising:
one or more instructions to generate a description of the possible allocation of the shared resources.

11. The non-transitory computer readable medium of claim 10, where the one or more instructions to generate the description of the possible allocation of the shared resources further comprise:
one or more instructions to generate a Hardware Description Language (HDL) description of the possible allocation.

12. The non-transitory computer readable medium of claim 1, further comprising:
one or more instructions to determine a possible pipeline resource allocation for the shared resources.

13. The non-transitory computer readable medium of claim 1, where the resources are computing resources that comprise one or more processing units.

14. The non-transitory computer readable medium of claim 1, where the resources are software resources, and where the non-transitory computer readable medium further comprises:
one or more instructions to determine a compilation pattern of instructions corresponding to the first tree-based representation based on the indication of the shared resources.

15. A method comprising:
receiving, on a processing device, a first tree-based representation of first resource usage patterns and a second tree-based representation of second resource usage patterns;
transforming the first tree-based representation into a first key-based representation, one or more nodes in the first tree-based representation including unordered children nodes, and the transforming of the first tree-based representation into the first key-based representation including:
imposing an ordering on the unordered children nodes of the one or more nodes in the first tree-based representation, wherein the imposing comprising:
identifying types of two or more children nodes, of the unordered children nodes,
applying, when the two or more children nodes are associated with different types, an ordering of the two or more children nodes based on the different types, and
applying, when the two or more children nodes are associated with a same type, an ordering of the two or more children nodes based on ordering of respective children nodes;
transforming the second tree-based representation into a second key-based representation;
determining one or more common patterns within the first key-based representation and the second key-based representation;
mapping at least one common pattern, of the one or more common patterns within the first key-based representation and the second key-based representation, to at least one subtree of the first tree-based representation; and
indicating the at least one subtree of the first tree-based representation as a pattern of resource use common between the first tree-based representation and the second tree-based representation.

16. The method of claim 15, where the first tree-based representation represents computing instructions, the method further comprising:
determining, based on the at least one subtree of the first tree-based representation, an instruction for an Instruction Set Extension (ISE) architecture.

17. The method of claim 15, further comprising:
identifying, based on the first key-based representation and the second key-based representation, at least one subtree of the first tree-based representation that does not have an isomorphic subtree within the second tree-based representation.

18. The method of claim 15, where determining one or more common patterns within both of the first key-based representation and the second key-based representation further comprises determining all common subkeys within the first key-based representation and the second key-based representation.

19. The method of claim 15, further comprising:
transforming a model into a third tree-based representation, the third tree-based representation comprising the first tree-based representation and the second tree-based representation.

20. The method of claim 19, further comprising:
mapping the at least one subtree of the first tree-based representation to a portion of the model.

21. The method of claim 20, further comprising:
visually marking, on a visual representation of the model, the portion of the model.

22. The method of claim 20, further comprising:
modifying at least a subset of elements in the portion of the model based on a pattern of resource use common between the first tree-based representation and the second tree-based representation.

23. A system comprising:
a memory to store a tree-based representation of the hardware computational resources, one or more nodes in the tree-based representation include unordered children nodes; and
a processing device to:
- transform the tree-based representation into a key-based representation the processing device, when transforming the tree-based representation, being further to impose an ordering on the unordered children nodes of the one or more nodes in the first tree-based representation, wherein the imposing comprising:
  - identify types of two or more children nodes, of the unordered children nodes,
  - when the two or more children nodes are associated with different types, apply an ordering of the two or more children nodes based on the different types, and
  - when the two or more children nodes are associated with a same type, apply an ordering of the two or more children nodes based on ordering of respective children nodes;
- analyze the key-based representation to locate repeating patterns within the key-based representation;
- map the repeating patterns within the key-based representation to repeating patterns within the tree-based representation; and
- modify the tree-based representation of the hardware computational resources to eliminate at least one instance of at least one repeating pattern within the tree-based representation without changing functional semantics of the tree-based representation.

24. The system of claim 23, where:
- the tree-based representation includes a first tree-based representation of first resource usage patterns and a second tree-based representation of second resource usage patterns;
- the processor device, when transforming the tree-based representation into the key-based representation is further to:
  - transform the first tree-based representation into a first key-based representation, and
  - transform the second tree-based representation into a second key-based representation; and
- the processor device, when analyzing the key-based representation to locate repeating patterns within the key-based representation, is further to:
  - determine one or more common subkeys within the first key-based representation and the second key-based representation.

25. The system of claim 24, where the first tree-based representation comprises a first subtree of a third tree-based representation, and where the second tree-based representation comprises a second subtree of the third tree-based representation.

* * * * *